US012237708B2

(12) United States Patent
Choe et al.

(10) Patent No.: US 12,237,708 B2
(45) Date of Patent: Feb. 25, 2025

(54) CHARGING APPARATUS AND METHOD OF SECONDARY BATTERY

(71) Applicants: LG Chem, Ltd., Seoul (KR); Auburn University, Auburn, AL (US)

(72) Inventors: Song-Yul Choe, Auburn, AL (US); Yilin Yin, Auburn, AL (US); Ha-Na Cho, Daejeon (KR); Won-Tae Joe, Daejeon (KR); Hyoung Jun Ahn, Daejeon (KR); Jin-Hyung Lim, Daejeon (KR)

(73) Assignees: Auburn University, Auburn, AL (US); LG Energy Solution, Ltd., Seoul (KR)

( * ) Notice: Subject to any disclaimer, the term of this patent is extended or adjusted under 35 U.S.C. 154(b) by 267 days.

(21) Appl. No.: 17/004,118

(22) Filed: Aug. 27, 2020

(65) Prior Publication Data

US 2021/0013731 A1  Jan. 14, 2021

Related U.S. Application Data

(63) Continuation of application No. PCT/KR2019/016504, filed on Nov. 27, 2019.

(Continued)

(30) Foreign Application Priority Data

May 23, 2019 (KR) .................. 10-2019-0060657

(51) Int. Cl.
*B60L 53/10* (2019.01)
*H02J 7/00* (2006.01)

(52) U.S. Cl.
CPC ............ *H02J 7/007182* (2020.01); *B60L 53/11* (2019.02); *H02J 7/007188* (2020.01)

(58) Field of Classification Search
CPC ........ H02J 7/007182; H02J 7/007188; B60L 53/11
See application file for complete search history.

(56) References Cited

U.S. PATENT DOCUMENTS 8,040,106 B2  10/2011  Ishikawa
9,197,089 B2  11/2015  Choe et al.
(Continued)

FOREIGN PATENT DOCUMENTS

CN    104142477 A    11/2014
CN    109075405 A    12/2018
(Continued)

OTHER PUBLICATIONS

Randall et al. "Controls oriented reduced order modeling of solid-electrolyte interphase layer growth". Journal of Power Sources, vol. 209, Jul. 1, 2012, pp. 282-288. (Year: 2012).*

(Continued)

*Primary Examiner* — Drew A Dunn
*Assistant Examiner* — Pamela J Jeppson
(74) *Attorney, Agent, or Firm* — Lerner David LLP

(57) ABSTRACT

A charging apparatus includes a control unit configured to determine an average ion concentration, a surface ion concentration and a solid phase potential for anode particles and an electrolyte potential in an anode, using a predefined electrochemical reduced order model. The control unit is further configured to determine a side reaction rate from the solid phase potential and the electrolyte potential. The control unit is further configured to reduce the magnitude of the charging current applied to a secondary battery based on at least one of a cutoff voltage, the surface ion concentration and the side reaction rate.

20 Claims, 35 Drawing Sheets

Related U.S. Application Data

(60) Provisional application No. 62/776,117, filed on Dec. 6, 2018.

(56) References Cited

U.S. PATENT DOCUMENTS

| | | |
|---|---|---|
| 9,834,112 B2 | 12/2017 | Lee |
| 2009/0259420 A1 | 10/2009 | Greening et al. |
| 2010/0085057 A1 | 4/2010 | Nishi et al. |
| 2013/0119921 A1* | 5/2013 | Choe .................. H01M 10/443 320/106 |
| 2014/0132225 A1* | 5/2014 | Jagenstedt ............ H02J 7/0071 320/160 |
| 2014/0333317 A1 | 11/2014 | Frost et al. |
| 2016/0336765 A1* | 11/2016 | Trimboli ................. H02J 1/102 |
| 2017/0271887 A1 | 9/2017 | Heo |
| 2017/0343612 A1 | 11/2017 | Tagade et al. |
| 2019/0054837 A1* | 2/2019 | Tanaka ...................... H02J 7/02 |
| 2020/0136173 A1* | 4/2020 | Hong ................ H01M 10/0525 |

FOREIGN PATENT DOCUMENTS

| | | |
|---|---|---|
| JP | 2007-141558 A | 6/2007 |
| JP | 2008243373 A | 10/2008 |
| JP | 2014-126411 A | 7/2014 |
| JP | 2014167406 A | 9/2014 |
| JP | 6145712 B2 | 6/2017 |
| KR | 101282687 B1 | 7/2013 |
| KR | 101375942 B1 | 3/2014 |
| KR | 20170134193 A | 12/2017 |
| WO | 2008154956 A1 | 12/2008 |
| WO | 2008154960 A1 | 12/2008 |
| WO | WO-2017183238 A1 * | 10/2017 .......... H01M 10/425 |

OTHER PUBLICATIONS

Choe et al. "Fast charging method based on estimation of ion concentrations using a reduced order of Electrochemical Thermal Model for lithium ion polymer battery," 2013 World Electric Vehicle Symposium and Exhibition (EVS27), 2013, pp. 1-11 (Year: 2013).*

Forman et al. "Reduction of an Electrochemistry-Based Li-Ion Battery Model via Quasi-Linearization and Pade Approximation" Journal of the Electrochemical Society, vol. 158, No. 2, Dec. 9, 2010 (Year: 2010).*

Choe Song-Yul et al., "Fast charging method based on estimation of ion concentrations using a reduced order of Electrochemical Thermal Model for lithium ion polymer battery", 2013 World Electric Vehicle Symposium and Exhibition (EVS27), Nov. 17, 2013, pp. 1-11.

Extended European Search Report for Application No. 19893667.6, dated Aug. 2, 2021, 10 pages.

International Search Report for Application No. PCT/KR2019/016504 mailed Apr. 28, 2020, 2 pages.

Kumar, "Reduced order model for a lithium ion cell with uniform reaction rate approximation," Journal of Power Sources, Jan. 15, 2013, pp. 426-441, vol. 222.

Lee, et al., "Extended operating range for reduced-order model of lithium-ion cells," Journal of Power Sources, Jun. 1, 2014, pp. 85-100, vol. 255.

Li, et al., "A Single Particle Model for Lithium-Ion Batteries with Electrolyte and Stress-Enhanced Diffusion Physics," Journal of the Electrochemical Society, Feb. 28, 2017, pp. A874-A883, vol. 164, No. 4.

Li, et al., "Reduced order model (ROM) of a pouch type lithium polymer battery based on electrochemical thermal principles for real time applications," Electrochimica Acta, May 1, 2013, pp. 66-78, No. 97.

* cited by examiner

CHARGING APPARATUS AND METHOD OF SECONDARY BATTERY

CROSS-REFERENCE TO RELATED APPLICATION

The present application is a continuation of International Application No. PCT/KR2019/016504 filed on Nov. 27, 2019, which claims priority to U.S. Patent Provisional Application No. 62/776,117 filed on Dec. 6, 2018 in the USA and Korean Patent Application No. 10-2019-0060657 filed on May 23, 2019 in the Republic of Korea, the disclosures of which are incorporated herein by reference.

TECHNICAL FIELD

The present disclosure relates to a charging apparatus and method of a secondary battery, and more particularly, to a charging apparatus and method capable of reducing a charging time and suppressing a degradation speed of a secondary battery in consideration of side reactions.

In the present disclosure, the nomenclature of symbols is as follows.
<Nomenclature>
A sandwich area of the cell ($cm^2$)
$a_s$ specific surface area of electrode ($cm^{-1}$)
BIL Battery-In-The-Loop
c ion concentration (mol $L^{-1}$)
$C_{ionloss}$ amount of ion loss caused by the side reactions (A h)
D diffusion coefficient in electrode ($cm^2\ s^{-1}$)
EC Ethylene Carbonate (electrolyte solvent)
EIS Electrochemical Impedance Spectroscopy
EKF Extended Kalman Filter
F Faraday constant (96,487 C $mol^{-1}$)
FOM Full Order Model
I current of the cell (A)
$i_0$ exchange current density (A $cm^{-2}$)
j reaction rate (A $cm^3$)
L thickness of micro cell (cm)
l coordinate along the thickness of micro cell
OCV Open Circuit Voltage (V)
Q capacity of the cell (A h)
R resistance ($\Omega\ cm^2$) or universal gas constant (8.3143 J $mol^{-1}\ K^{-1}$)
$R_s$ radius of spherical electrode particle (cm)
ROM Reduced Order Model
r coordinate along the radius of spherical electrode particle (cm)
SOC State Of Charge
SEI Solid Electrolyte Interphase
T cell temperature (K)
t time (s)
$U_{eq}$ equilibrium potential (V)
$V_t$ terminal voltage of cell (V)
x stoichiometric number of the anode
y stoichiometric number of the cathode
[Greek symbols]
$\alpha$ transfer coefficient of reaction
$\delta$ thickness (mm)
$\varepsilon$ volume fraction of a porous medium or strain
$\varphi$ electric potential (V)
$\eta$ surface overpotential of electrode reaction (V)
$\kappa$ ionic conductivity (S $cm^{-1}$)
$\sigma$ conductivity (S $cm^{-1}$)
$\tau$ total time (s)
[Subscripts and Superscripts]
a anodic
aged aged cell
ave average value
c cathodic
e electrolyte phase
eff effective
eq equilibrium
fresh fresh cell
ionloss caused by loss of lithium ion
Li lithium ion
max maximum
s solid phase
side the side reaction
surf electrode particle surface
− negative electrode (anode)
+ positive electrode (cathode)

BACKGROUND ART

Lithium-ion battery is considered as one of the most promising energy storages used for electric vehicles (EVs) because of its high power and energy density. The lithium-ion battery is charged from different power sources like an AC (Alternating Current) grid or electric motors driven by an engine or in regenerative mode.

Currently, there are two technical barriers to overcome for rapid and wide acceptance of EVs in markets, which includes relatively short driving range and long charging time.

The driving range can be extended by installation of more number of batteries, which adversely leads to an increase of charging time.

There have been several attempts to reduce the charging time with high power chargers such as DC fast charging (50 kW), super charger (140 kW) or extreme fast charging (350 kW). However, the resulting increased charging currents accelerates degradation, which significantly reduces the lifespan of the batteries and generates more heat.

Thus, the challenging issues of designing a fast charging method are not only to reduce the charging time, but also to keep the degradation rate as low as possible that leads to less heat generation.

Design of charging methods for lithium-ion battery should consider various operation aspects given in the specification of battery such as capacity, cutoff voltage, maximum temperature and maximum charging current, and temperature range in addition to power available from a charger.

Generally, there are three basic charging methods that include constant current (CC), constant power (CP) and constant voltage (CV), which can be used to design the new charging methods.

The CC charging method uses a constant current, which enables reduction of the charging time, but might overcharge a battery even with a small current. When the battery is charged with the CP charging method, the current at the beginning is relatively high, which can reduce the charging time, but also cause overcharging. The CV charging can prevent a battery from overcharging. However, like the CC charging, the charging current at low SOC becomes high, which induces a high temperature rise and a high degradation rate.

Combination of CC with CV or CP with CV charging prevents the overcharging, temperature rise and high degradation rate, which results in constant current constant voltage (CC/CV) charging method or constant power constant voltage (CP/CV) charging method.

The charging methods which combine two different charging methods use CC charging or CP charging to charge the battery until a cutoff voltage is reached and then use CV charging mode to fully charge the battery. In fact, charging currents by CP/CV charging at low SOC is higher than that by CC/CV charging because of the current peak that cannot be easily limited. Therefore, the CC/CV charging method is widely preferred because of prevention of the overcharging and limitation of the high charging current at the beginning, which assures the safe operation and less degradation rate.

There are many suggestions for optimization of the CC/CV charging method with respect to the charging time, degradation, heat generation and safety, using electric equivalent circuit models (EECM) or electrochemical models.

The EECM may be used to estimate SOC, impedances and temperature rise. In different SOC ranges, charging currents having different magnitude are used to charge the battery, which reduces the charging time while maintaining the degradation speed.

The inaccuracy of estimated SOC caused by hysteresis can be removed by restricting the hysteresis. The impedances of battery are used to limit the heat generation rate, which reduces the degradation speed caused by high temperature. The temperature rise induced by high charging currents may be limited by combining a thermal model with the EECM.

These charging methods enable to reduce the charging time but have not considered the degradation effects. As a matter of fact, the EECM does not describe the internal mechanisms of the battery taking place during charging processes of the battery such as ion transport, electrochemical reaction, intercalation/de-intercalation and ion diffusion. As a result, it is impossible to optimize the high charging currents considering the aging speed.

The internal processes of a battery can be accurately described using electrochemical principles. A large format pouch type cell with multiple layers may be simplified to a micro cell under assumptions that there are no thermal and ion gradient in lateral direction and the current collectors on each layer have the same potential. The micro cell is a sandwich structure that includes an anode and a cathode, and a separator. The anode and the cathode have a structure in which active material particles are coated on a current collector.

It may be assumed that electrodes include spherical particles with the same radius, which are in contact with each other, and lithium ions are transported through the plane and diffused in particles. The model considering this structure is called a full order model (FOM) with pseudo-two-dimensions (P2D), which will be abbreviated as P2D-FOM.

The P2D-FOM can estimate SOC and anode potentials, which are used in the design of fast charging methods to reduce the charging currents and prevent overcharge. However, even in P2D-FOM, side reactions that represent the main cause of degradation are not considered. In addition, P2D-FOM is so inadequate to be included in a real controller due to the high computational time caused by the complex governing equations.

When the partial differential equations and nonlinear equations of the P2D-FOM can be simplified to ordinary differential equations and linearized to linear equations, the P2D-FOM becomes a reduced order model (ROM) that can be better embedded in controllers like battery management systems. The transformation of the P2D-FOM into the reduced order model is disclosed in X. Li, M. Xiao, and S. Y. Choe. "Reduced order model (ROM) of a pouch type lithium polymer battery based on electrochemical thermal principles for real time applications." Electrochimica Acta 97 (2013): 66-78.

In single particle reduced order model (SP-ROM) which is another reduced order model, it is assumed that both the anode active material layer and the cathode active material layer include spherical particles of the same shape and current distribution is uniform in an anode and a cathode, which further makes P2D-FOM simpler than P2D-ROM does. The SP-ROM is disclosed in J. Li, N. Lotfi, R. G. Landers, and J. Park. "A Single Particle Model for Lithium-Ion Batteries with Electrolyte and Stress-Enhanced Diffusion Physics." Journal of The Electrochemical Society 164, no. 4 (2017): A874-A883.

In order to maximize battery life at a fast charging, SP-ROM is used where the charging current profile is optimized by considering limitations given by SOC, terminal voltage, anode potential and temperature. However, side reactions are not considered even in the SP-ROM.

Even though calculation of SP-ROM is faster than that of P2D-ROM, the P2D-ROM have several advantages in accuracy and particularly in calculation of the gradient of ion concentration in solid and current distributions. There are some suggestions using the P2D-ROM to optimize a charging method by considering SOC, surface ion concentration and temperature rise. However, side reactions dependent upon operating conditions such as SOC, anode potential, ion concentration are not yet considered.

SUMMARY

Technical Problem

The present disclosure is designed to solve the problems of the related art, and therefore the present disclosure is directed to provide a charging apparatus and method of a secondary battery, which may reduce the charging time and suppress the degradation speed by quantitatively estimating the side reaction rate generated in the secondary battery while being charged, and controlling charging of the secondary battery in consideration of the side reaction rate.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a charging apparatus of a secondary battery, comprising a voltage sensor configured to measure a voltage of the secondary battery; a temperature sensor configured to measure a temperature of the secondary battery; and a control unit configured to receive a measured voltage value and a measured temperature value from the voltage sensor and the temperature sensor, respectively, and to adjust a magnitude of a charging current applied to the secondary battery.

Preferably, the control unit is configured to:
determine an internal state of the secondary battery, which includes an average ion concentration of anode particles, a surface ion concentration of the anode particles, an anode particle potential and an anode electrolyte potential, using a predefined electrochemical reduced order model (ROM);

determine a state of charge (SOC) of the secondary battery from the average ion concentration; determine a side reaction rate from the anode particle potential and the anode electrolyte potential; determine whether at least one charging current control condition is satisfied, wherein the at least one charging current control condition includes at least one of (i) a first condition that the measured voltage value reaches a cutoff voltage, (ii) a second condition that the surface ion concentration of the anode particles reaches an upper limit concentration or (iii) a third condition that the side reaction rate reaches an upper limit rate; and reduce the magnitude of the charging current applied to the secondary battery in response to a determination that at least one charging current control condition is satisfied.

In one aspect of the present disclosure, the electrochemical reduced order model may be derived from a full order model defined by an ion conservation equation in an electrode, an ion conservation equation in an electrolyte, a charge conservation equation in the electrode, a charge conservation equation in the electrolyte and an electrochemical kinetics equation as follows:

[Ion Conservation Equation in the Electrode]

$$\frac{\partial c_s}{\partial t} = \frac{D_s}{r^2}\frac{\partial}{\partial r}\left(r^2 \frac{\partial c_s}{\partial r}\right)$$

$$\frac{1}{r}\frac{\partial c_s}{\partial r}\bigg|_{r=0} = 0 \text{ and } D_s\frac{\partial c_s}{\partial r}\bigg|_{r=R_s} = \frac{-j^{Li}}{a_s F}$$

($c_s$: ion concentration in solid phase, $D_s$: diffusion coefficient in solid phase, $R_s$: radius of a spherical electrode particle, $j^{Li}$: lithium reaction rate, $a_s$: specific surface area of the electrode, F: Faraday constant, r: spherical coordinate)

[Ion Conservation Equation in the Electrolyte]

$$\frac{\partial(\varepsilon_e c_e)}{\partial t} = \frac{\partial}{\partial x}\left(D_e^{\mathit{eff}}\frac{\partial}{\partial x}c_e\right) + \frac{1-t_+^0}{F}j^{Li}$$

$$\frac{\partial c_e}{\partial x}\bigg|_{x=0} = \frac{\partial c_e}{\partial x}\bigg|_{x=L} = 0$$

($\varepsilon_e$: porosity, $c_e$: ion concentration in the electrolyte, $D_e^{\mathit{eff}}$: effective diffusion coefficient in the electrolyte, L: distance between two electrodes separated by the electrolyte, $j^{Li}$: lithium reaction rate, $t_+^0$: lithium transference number, F: Faraday constant, t: time)

[Charge Conservation Equation in the Electrode]

$$\frac{\partial}{\partial x}\left(\sigma^{\mathit{eff}}\frac{\partial}{\partial x}\varphi_s\right) - j^{Li} = 0$$

$$-\sigma^{\mathit{eff}}\frac{\partial}{\partial x}\varphi_s\bigg|_{x=0} = -\sigma^{\mathit{eff}}\frac{\partial}{\partial x}\varphi_s\bigg|_{x=L} = \frac{I}{A}$$

$$\frac{\partial}{\partial x}\varphi_s\bigg|_{x=\delta_-} = \frac{\partial}{\partial x}\varphi_s\bigg|_{x=\delta_-+\delta_{sep}} = 0$$

($\sigma^{\mathit{eff}}$: effective conductivity, $\varphi_s$: potential in solid phase, $\delta_-$: thickness of an anode active material layer, $\delta_{sep}$: thickness of a separator, I: current, A: area of a cell, x: coordinate along a moving direction of ions)

[Charge Conservation Equation in the Electrolyte]

$$\frac{\partial}{\partial x}\left(\kappa^{\mathit{eff}}\frac{\partial}{\partial x}\varphi_e\right) + \frac{\partial}{\partial x}\left(\kappa_D^{\mathit{eff}}\frac{\partial}{\partial x}\ln c_e\right) + j^{Li} = 0$$

$$\frac{\partial}{\partial x}\varphi_e\bigg|_{x=0} = \frac{\partial}{\partial x}\varphi_e\bigg|_{x=L} = 0$$

($\kappa^{\mathit{eff}}$: effective ionic conductivity, $\varphi_e$: electrolyte potential, L: distance between the two electrodes, $j^{Li}$: lithium reaction rate, x: coordinate along the moving direction of ions)

[Electrochemical Kinetics Equation]

$$j^{Li} = a_s i_0\left\{\exp\left[\frac{\alpha_a nF}{RT}\eta\right] - \exp\left[-\frac{\alpha_c nF}{RT}\eta\right]\right\}$$

($j^{Li}$: lithium reaction rate, $a_s$: specific surface area of an electrode, $i_0$: exchange current density, $\alpha_a$: anodic reaction transfer coefficient, $\alpha_c$: cathodic reaction transfer coefficient, $\eta$: surface overpotential of an electrode, n: the number of ions involved in main reactions, F: Faraday constant, R: universal gas constant, T: temperature).

Preferably, the electrochemical reduced order model may include a reduced order equation (i)' in which the ion conservation equation in the electrode is simplified by polynomial approximation:

(i)' ion conservation equation in the electrode:

$$\frac{d}{dt}c_{s,ave} + 3\frac{j^{Li}}{R_s a_s F} = 0$$

$$\frac{d}{dt}q_{ave} + 30\frac{D_s}{R_s^2}q_{ave} + \frac{45}{2}\frac{j^{Li}}{R_s^2 a_s F} = 0$$

$$35\frac{D_s}{R_s}(c_{s,surf} - c_{s,ave}) - 8D_s q_{ave} = -\frac{j^{Li}}{a_s F}$$

($c_{s,ave}$: average ion concentration in solid phase, $c_{s,surf}$: surface ion concentration in solid phase, $D_s$: diffusion coefficient in solid phase, $R_s$: radius of a spherical electrode particle, $j^{Li}$: lithium reaction rate, $a_s$: specific surface area of an electrode, F: Faraday constant, $q_{ave}$: volume-averaged concentration fluxes in solid phase, t; time).

Preferably, the electrochemical reduced order model may include a reduced order equation (ii)' in which the ion conservation equation in the electrolyte is simplified into a state-space equation:

(ii)' ion conservation equation in the electrolyte:

$$\dot{c}_e = A^* \cdot c_e + B^* \cdot I$$

$$y = C^* \cdot c_e + D^* \cdot I$$

$c_e$: state variable in a system
A*: first matrix of eigenvalues recombined through reduction
B*: identity matrix of [n×1] size
C*: second matrix of residues and eigenvalues recombined through reduction
D*: sum of residues recombined through reduction and steady state vector value
I: current
y: ion concentration in the electrolyte.

Preferably, the electrochemical reduced order model may include a reduced order equation (iii)' in which the charge conservation equation in the electrode is simplified using a finite difference method:

(iii)' charge conservation equation in the electrode:

$$\frac{\partial}{\partial x}\left(\frac{\partial}{\partial x}\varphi_s\right) = \frac{j^{Li}}{\sigma^{eff}}$$

$$-\sigma^{eff}\frac{\partial}{\partial x}\varphi_s\bigg|_{x=0} = -\sigma^{eff}\frac{\partial}{\partial x}\varphi_s\bigg|_{x=L} = \frac{I}{A}$$

$$\frac{\partial}{\partial x}\varphi_s\bigg|_{x=\delta_-} = \frac{\partial}{\partial x}\varphi_s\bigg|_{x=\delta_-+\delta_{sep}} = 0$$

($\sigma^{eff}$: effective conductivity, $\varphi_s$: potential in solid phase, $\delta_-$: thickness of the anode active material layer, $\delta_{sep}$: thickness of a separator, I: current, A: area of the cell, $j^{Li}$: lithium reaction rate, x: coordinate along the moving direction of ions).

Preferably, the electrochemical reduced order model may include a reduced order equation (iv)' in which the charge conservation equation in the electrolyte is simplified using a finite difference method:

(iv)' charge conservation equation in the electrolyte:

$$\frac{\partial}{\partial x}\left(\frac{\partial}{\partial x}\varphi_e\right) + \frac{j^{Li}}{\kappa^{eff}} = 0$$

$$\frac{\partial}{\partial x}\varphi_e\bigg|_{x=0} = \frac{\partial}{\partial x}\varphi_e\bigg|_{x=L} = 0$$

($\kappa^{eff}$: effective ionic conductivity, $\varphi_e$: electrolyte potential, L: distance between the two electrodes, $j^{Li}$: lithium reaction rate, x: coordinate along the moving direction of ions).

Preferably, the electrochemical reduced order model may include a reduced order equation (v)' in which the electrochemical kinetics equation is simplified using linearization:

(v)' electrochemical kinetics equation:

$$j^{Li} = a_s i_0 \frac{n(\alpha_a + \alpha_c)F}{RT}\eta$$

($j^{Li}$: lithium reaction rate, $a_s$: specific surface area of the electrode, $i_0$: exchange current density, $\alpha_a$: anodic reaction transfer coefficient, $\alpha_c$: cathodic reaction transfer coefficient, $\eta$: surface overpotential of an electrode, n: a total number of ions involved in main reactions, F: Faraday constant, R: universal gas constant, T: temperature).

Preferably, the control unit may be configured to determine a state of the secondary battery from the average ion concentration of the anode particles using a following SOC equation:

$$SOC = \frac{1}{\delta_-}\int_0^{\delta_-} \frac{(c_{s,ave} - c_{s,max}Stoi_{100})}{c_{s,max}(Stoi_{100} - Stoi_0)}$$

(SOC: State Of Charge, $\delta_-$: thickness of an anode active material layer, $c_{s,ave}$: average ion concentration in solid phase, $c_{s,max}$: maximum ion concentration in solid phase, $Stoi_{100}$: stoichiometry at 100% SOC, $Stoi_0$: stoichiometry at 0% SOC).

Preferably, the control unit may be configured to determine the side reaction rate of the secondary battery using a following plurality of side reaction kinetics equations:

$$j_{side}^{Li} = -i_{0,side}a_s\exp\left(-\frac{\alpha_{c,side}n_{side}F}{RT}\eta_{side}\right)$$

$$\eta_{side} = \varphi_{s-} - \varphi_{e-} - U_{eq,-} - \frac{R_{SEI}}{a_s}j_{total}^{Li}$$

$$i_{0,side} = k_{side}\sqrt{c_{s,surf}c_{EC,R_s}}$$

($j_{side}^{Li}$: side reaction rate of lithium, $U_{eq,-}$: equilibrium potential in anode, $i_{0,side}$: exchange current density of side reaction, $R_{SEI}$: resistance of solid electrolyte interphase, $a_s$: specific surface area of an electrode, $j_{total}^{Li}$: total reaction rate of lithium, $\alpha_{c,side}$: reaction transfer coefficient of the side reaction in a cathode, $k_{side}$: kinetic rate constant of the side reaction, $n_{side}$: a total number of ions involved in the side reaction, $c_{s,surf}$: surface ion concentration in solid phase, $\eta_{side}$: overpotential of the side reaction, $c_{EC,R_s}$: electrolyte concentration at a solid phase surface, F: Faraday constant, R: universal gas constant, T: temperature, $\varphi_{s-}$: solid phase potential in the anode, $\varphi_{e-}$: anode electrolyte potential).

Preferably, the control unit may be configured to repeatedly perform a time update and to repeatedly determine the internal state of the secondary battery to minimize a difference between the measured voltage of the secondary battery and an estimated voltage using an extended Kalman filter using a state-space equation for the internal state of the secondary battery, wherein the state-space equation includes an average ion concentration ($c_{s,ave}^k$) in solid phase, an volume-averaged concentration flux ($q_{ave}^k$) in solid phase and surface ion concentration ($c_{s,surf}^k$) in solid phase, and an output equation for a voltage ($V_t$) of the secondary battery, and wherein the state-space equation is defined as follows:

[A State-Space Equation]

$$c_{s,ave}^k = c_{s,ave}^{k-1} - 3\frac{j^{Li,k}\Delta t}{R_s a_s F}$$

$$q_{ave}^k = q_{ave}^{k-1} - 30\frac{D_s\Delta t}{R_s^2}q_{ave}^{k-1} - \frac{45}{2}\frac{j^{Li,k}\Delta t}{R_s^2 a_s F}$$

$$c_{s,surf}^k = c_{s,ave}^k + \frac{8R_s q_{ave}^k}{35} - \frac{R_s j^{Li,k}}{35 D_s a_s F}$$

($c_{s,ave}$: average ion concentration in solid phase, $c_{s,surf}$: surface ion concentration in solid phase, $q_{ave}$: volume-averaged concentration fluxes, $j^{Li}$: lithium reaction rate, $a_s$: specific surface area of an electrode, F: Faraday constant, $D_s$: diffusion coefficient in solid phase, $R_s$: radius of a spherical electrode particle, $\Delta t$: update interval)

[Output Equation]

$$V_t = \varphi_s^+ - \varphi_s^- - R_{film}I$$

$$\eta = \varphi_s - \varphi_e + U_{eq}(c_{s,surf}) + \frac{R_{film}}{a_s}j^{Li}$$

($V_t$: voltage, $\varphi_s^+$: solid phase potential in a cathode, $\varphi_s^-$: solid phase potential in an anode, $\varphi_e$: electrolyte potential, $U_{eq}$: equilibrium potential, $\eta$: surface overpotential of the electrode, $c_{s,surf}$: surface ion concentration of a solid phase particle, $R_{film}$: ohmic resistance in battery, I: current, A: area of a cell, $R_{SEI}$: SEI resistance, $a_s$: specific surface area of the electrode, $j^{Li}$: lithium reaction rate).

Preferably, the control unit may be configured to control a charger, which is coupled to the secondary battery to apply the charging current to the secondary battery, to adjust the magnitude of the charging current.

In another aspect of the present disclosure, there is also provided an electric-driven apparatus, comprising the apparatus of any of the embodiments described herein.

In another aspect of the present disclosure, there is also provided a charging method of a secondary battery, comprising: (a) measuring a voltage and a temperature of the secondary battery; (b) determining internal states of the secondary battery, which include an average ion concentration of anode particles, a surface ion concentration of the anode particles, an anode particle potential and an anode electrolyte potential, using a predefined electrochemical ROM; (c) determining a SOC of the secondary battery from the average ion concentration of the anode particles; (d) determining a side reaction rate from the anode particle potential and the anode electrolyte potential; (e) determining whether at least one charging current control condition is satisfied, wherein the at least one charging current control condition includes at least one of (i) a first condition that the measured voltage value reaches a cutoff voltage, (ii) a second condition that the surface ion concentration of the anode particles reaches a upper limit concentration and (iii) a third condition that the side reaction rate reaches a upper limit rate is satisfied; and (f) reducing the charging current applied to the secondary battery in response to a determination that at least one charging current control condition is satisfied.

Advantageous Effects

The charging apparatus and method according to the present disclosure is designed using ROM including a side reaction rate model, where cutoff voltage, saturation of surface ion concentration in the anode, and maximum side reaction rate are used to limit the charging currents. The charging apparatus and method according to the present disclosure reduces about a half of the charging time compared with a conventional CC/CV charging protocol. The limitation for surface ion concentration in the anode may suppress capacity and power fade. The charging method limited by the surface ion concentration and the side reaction rate is the best one among charging methods tested with respect to charging time and degradation.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawings.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is deemed that a detailed description of a related known structure or function may obscure the subject matter of the present disclosure, the detailed description thereof will be omitted.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed therebetween.

In the specification, a secondary battery means one independent cell that has an anode electrode terminal and a cathode terminal and is physically separable. For example, one pouch-type lithium polymer cell may be considered as a secondary battery. However, the present disclosure is not limited to the kind of secondary battery.

Figure 1:
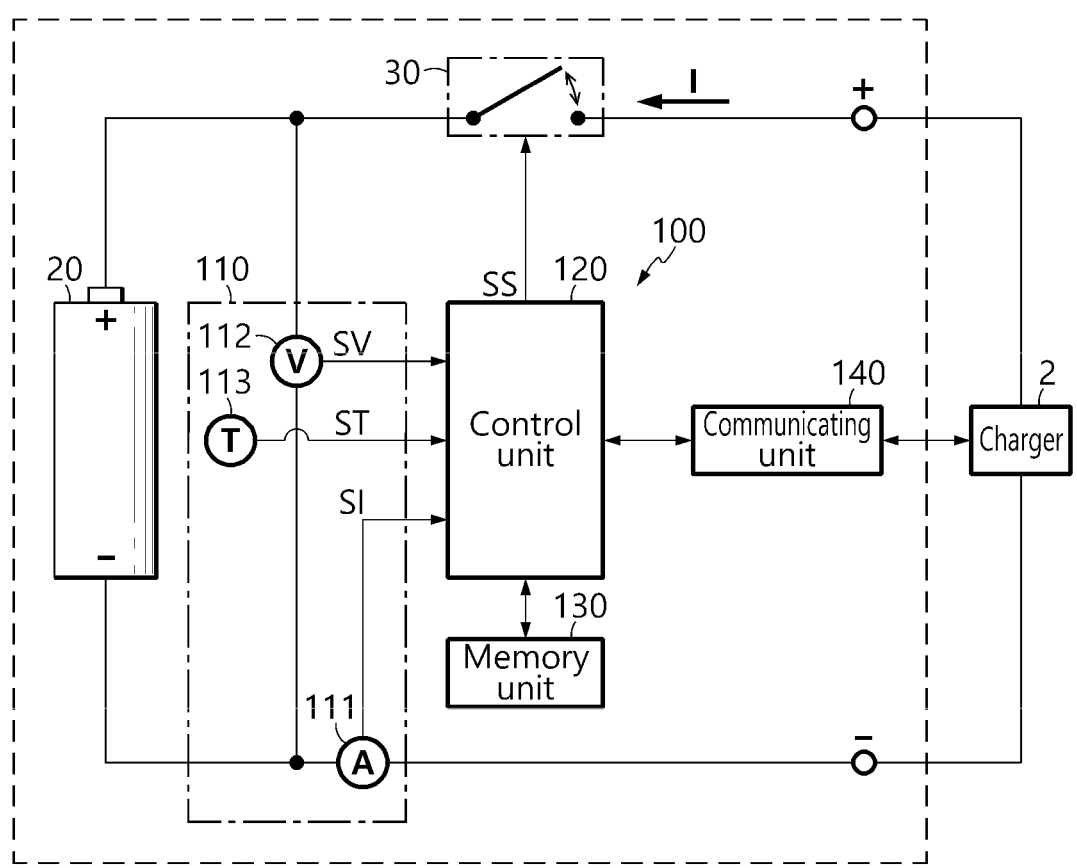
FIG. 1 is a block diagram showing a charging apparatus of a secondary battery according to an embodiment of the present disclosure.

FIG. 1 is a block diagram showing a charging apparatus 100 of a secondary battery according to an embodiment of the present disclosure.

Referring to FIG. 1, the charging apparatus 100 of a secondary battery according to an embodiment of the present disclosure is a device for controlling charging of a secondary battery 20 and is electrically coupled to the secondary battery 20.

The secondary battery 20 supplies an electrical energy required for a power system such as an electric vehicle and includes at least one battery cell. The battery cell may be, for example, a lithium-ion battery.

In the present disclosure, the battery cell is not limited to the lithium-ion battery, and a battery cell capable of charging and discharging may be used without limitation. The battery cells included in the secondary battery 20 are electrically connected in series and/or in parallel.

A switch 30 is installed on a current path for charging and discharging the secondary battery 20. A control terminal of the switch 30 is provided to be electrically connected to a control unit 120. The switch 30 is turned on or off in accordance with a duty ratio of a switching signal SS output from the control unit 120. The switch 30 may be a field effect transistor or a mechanical relay.

The charging apparatus 100 of a secondary battery determines an internal state of the secondary battery 20 by using an electrochemical reduced order model (ROM) and adjusts the magnitude of a charging current applied to the secondary battery 20 in consideration of the internal state.

To this end, the charging apparatus 100 includes a sensing unit 110, a control unit 120, a memory unit 130, and a communication unit 140.

According to an embodiment, the internal state includes an average ion concentration and a surface ion concentration of an anode, a potential in the anode, a potential in an anode electrolyte, a side reaction rate of lithium ions, and a state of charge (SOC). Here, the average ion concentration and the surface ion concentration refer to an average ion concentration of active material particles and a surface ion concentration of active material particles.

The sensing unit 110 is configured to detect physical/electrical variables associated with the internal states of the secondary battery 20 at time intervals. The physical/electrical variables include voltage, current and temperature of the secondary battery 20.

The sensing unit 110 includes a current measuring means 111, a voltage measuring means 112, and a temperature measuring means 113.

The current measuring means 111 is provided to be electrically connected to the charge/discharge path of the secondary battery 20. The current measuring means 111 is configured to detect a current flowing through the secondary battery 20 and output a first sensing signal SI representing the detected current to the control unit 120. A Hall Effect sensor, a shunt resistor or the like may be used as the current measuring means 111.

The voltage measuring means 112 is provided to be electrically connected to a cathode terminal and an anode terminal of the secondary battery 20. The voltage measuring means 112 is configured to detect a voltage across the secondary battery 20 (that is, a potential difference between the cathode terminal and the anode terminal of the secondary battery 20) and output a second sensing signal SV indicating the detected voltage to the control unit 120. The voltage measuring means 112 includes a common voltage measuring circuit.

The temperature measuring means 113 is configured to detect a temperature of the secondary battery 20 and output a third sensing signal ST indicating the detected temperature to the control unit 120. The temperature measuring means 113 may be a thermocouple.

The control unit 120 is operably coupled to the sensing unit 110, the memory unit 130, the communication unit 140 and the switch 30. The control unit 120, in hardware, may be implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 120 is configured to periodically receive the first sensing signal SI, the second sensing signal SV and the third sensing signal ST output by the sensing unit 110. The control unit 120 uses an analog-to-digital converter (ADC) included in the control unit 120 to convert each of the first sensing signal SI, the second sensing signal SV and the third sensing signal ST in analog form, which are received at each unit time, into a current value, a voltage value and a temperature value in digital form, and then store the converted value in the memory unit 130. That is, in the memory unit 130, a current history, a voltage history and a temperature history of the secondary battery 20 may be stored at each unit time.

The memory unit 130 is operably coupled to the control unit 120. The memory unit 130 may store a program and various data necessary for executing control logics, explained later. The memory unit 130 may include, for example, at least one storage medium selected from a flash memory type, a hard disk type, a solid state disk (SSD) type, a silicon disk drive (SDD) type, a multimedia card micro type, a random access memory (RAM), a static random access memory (SRAM), a read-only memory (ROM), an electrically erasable programmable read-only memory (EE-PROM), and a programmable read-only memory (PROM).

The communication unit 140 may be communicatively coupled to a charger 2. The charger 2 applies a charging current to the secondary battery 20 according to a request of the control unit 120. The magnitude of the charging current is determined by the control unit 120. The magnitude of the charging current is expressed in C-rate. The control unit 120 transmits a charging current adjustment message to the charger 2 in order to adjust (reduce) the magnitude of the charging current if the side reaction rate or the surface ion concentration in the anode reaches a preset upper limit or if the terminal voltage of the secondary battery 20 reaches a cutoff voltage, in consideration of the electrochemical model. Then, the charger 2 reduces the magnitude of the charging current according to the request of the control unit 120. The charger 2 may be a charging station used to charge an electric vehicle, or a charger installed inside the electric vehicle.

The charger 2 includes, for example, an electronic control unit (ECU). The communication unit 140 may send and receive messages required to adjust the magnitude of the charging current to/from the ECU of the charger 2. The communication unit 140 may communicate with the charger 2 through a wired network such as RS-232, a local area network (LAN), a controller area network (CAN) and a daisy chain and/or a short distance wireless network such as Bluetooth, Zigbee, Wi-Fi, etc. However, it is obvious that the present disclosure is not limited by the communication protocol.

The control unit 120 estimates the internal state of the secondary battery 20, which includes an average ion concentration of the anode particles, an volume-averaged concentration fluxes, a surface ion concentration and a side reaction rate, by using an electrochemical reduced order model to reduce a charging time of the secondary battery 20 and reduce degrading of the secondary battery 20 as much as possible.

Hereinafter, the side reaction inside the secondary battery 20, which is one of main causes degrading the secondary battery 20, will be described in detail.

The charging time of secondary battery 20 may be simply reduced as the charging current increased. However, the increased charging current not only generates more heat but also accelerates the aging of the secondary battery 20.

In many researches associated with the aging mechanism performed using lithium-ion batteries with nickel-manganese-cobalt oxide/graphite or lithium iron phosphate/graphite species, it has been revealed that side reactions occurring at the surface of anode particles under different operating conditions are a major cause of aging.

The side reaction is a reduction process between an electrolyte solvent (e.g., ethylene carbonate) and lithium ion at the surface of the anode particle. By-products of the side reaction form a very thin film that adheres to the surface of the anode particles. The corresponding film is called a solid electrolyte interphase (SEI) layer.

Initially, as the SEI layer is formed, further side reactions slows down. However, the side reactions take place continuously throughout the battery life because the anode always operates at the potential that is outside the stability window of the electrolyte.

The deposits produced by the side reactions are accumulated on the surface of the anode particles and result in the growth of a SEI layer. Particularly, the SEI layer at the anode particles located next to the separator grows faster among others and forms an extra deposit layer.

As a result, the ionic resistance of the SEI layers increases, and the surface area and pores of the active material accessible by lithium ions decrease. Since the SEI layers are electrical isolators that may completely isolate some anode particles from electrons, this leads to a loss of active anode material and finally capacity fade. In addition to the active material loss, the consumed ions and electrolyte solvents caused by the side reactions are another factors for capacity fade.

The side reactions are enhanced by favorite operating conditions like elevated temperatures and high SOC ranges. A high charging current also promotes the side reactions, which is analyzed later. When the temperature rises, the reaction kinetics of lithium ions and electrolyte solvents get increased, and as a result, more ions are passing through the SEI layer and reaching at the interface where the side reactions occur. Thus, the concentrations of both ions and solvents at the surface of the particles increase, which results in a high side reaction rate.

The effects of SOC ranges and magnitude of the charging current on the side reactions may be better explained with help of the relationship of potentials at the interface between the anode particle and the electrolyte.

Figure 2:
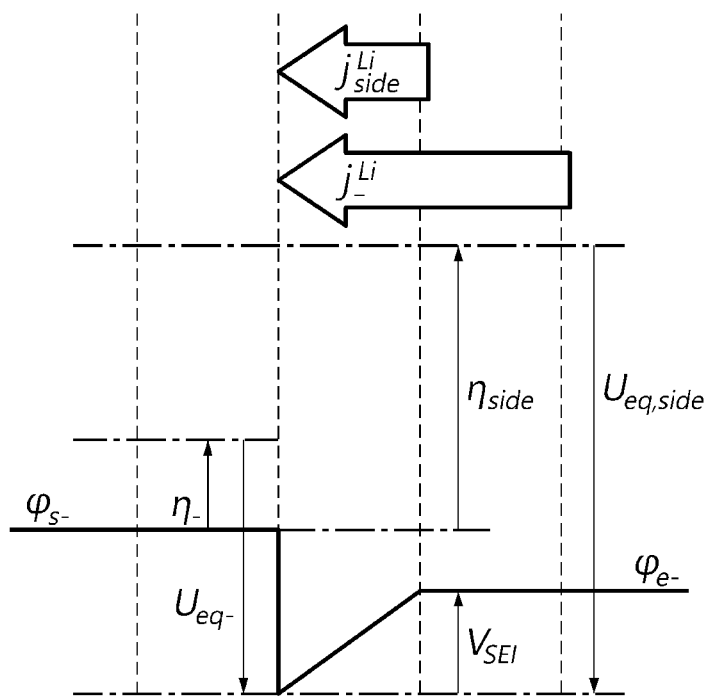
FIG. 2 is a schematic diagram showing potential relationship at an anode while the secondary battery is being charged.

A schematic diagram of the potential relationship at the anode side during charging is depicted in FIG. 2.

When the secondary battery 20 is charged, two chemical reactions including a main reaction and a side reaction take place. The total reaction rate, $j_{total}^{Li}$, is expressed as a sum of both reaction rates as in Equation (1) below.

$$j_{total}^{Li} = j_-^{Li} + j_{side}^{Li} \quad (1)$$

Here, $j_-^{Li}$ and $j_{side}^{Li}$ represent reaction rates of the main reaction and the side reaction.

The main reaction rate, $j_-^{Li}$, produced by the main reaction at the interface between the anode particle and the electrolyte is a function of overpotential, $\eta_-$ and expressed by the Bulter-Volmer (B-V) equation as in Equation (2) below.

$$j_-^{Li} = a_s i_0 \left( \exp\left(\frac{\alpha_a nF}{RT}\eta_-\right) - \exp\left(-\frac{\alpha_c nF}{RT}\eta_-\right) \right) \quad (2)$$

Here, $a_s$ is a specific surface area in which the main reaction occures. $\alpha_a$ and $\alpha_c$ are the anodic and cathodic transfer coefficients, which are assumed to be 0.5. n is the number of ions participating in the main reaction, which is equal to 1. R is the universal gas constant (8.3143 J mol$^{-1}$ K$^{-1}$). $i_0$ is the exchange current density. T is the cell temperature.

The side reaction rate, $j_{side}^{Li}$, may be calculated using the B-V equation as in Equation (3) below.

$$j_{side}^{Li} = -i_{0,side} a_s \exp\left(-\frac{\alpha_{c,side} n_{side} F}{RT} \eta_{side}\right) \quad (3)$$

The overpotential ($\eta_-$) in the B-V equation (2) above may be expressed as follows.

$$\eta_- = \varphi_{s-} - \varphi_{e-} - U_{eq,-} - \frac{R_{SEI}}{a_s} j_{total}^{Li} \quad (4)$$

Here, $\varphi_{s-}$ and $\varphi_{e-}$ are the electric potentials of the solid anode particle and the electrolyte, respectively.

The equilibrium potential of the anode, $U_{eq,-}$, is a function of stoichiometric number that corresponds to the ratio between the ion concentration in solid phase and its maximum value. $R_{SEI}$ is the resistance of the SEI layer that causes a potential drop across the SEI. The potential drop may be expressed as in Equation (5) below.

$$V_{SEI} = \frac{R_{SEI}}{a_s} j_{total}^{Li} \quad (5)$$

In Equation (3), $n_{side}$ is the number of ions involved in the side reactions that is equal to 2. $\eta_{side}$ is the overpotential of side reactions and may be expressed as in Equation (6) below.

$$\eta_{side} = \varphi_{s-} - \varphi_{e-} - U_{eq,side} - \frac{R_{SEI}}{a_s} j_{total}^{Li} \quad (6)$$

Here, $U_{eq,side}$ is the equilibrium potential of the side reactions. The exchange current density of the side reactions, $i_{0,side}$, is a concentration function of two reactants of the side reactions, namely lithium ions and electrolyte solvents such as ethylene carbonate (EC) molecules and may be expressed as in Equation (7) below.

$$i_{0,side} = k_{side} \sqrt{c_{s,surf} c_{EC,R_s}} \quad (7)$$

Here, $k_{side}$ is the kinetic rate constant for the side reactions. $c_{s,surf}$ and $c_{EC,R_s}$ are the concentrations of the lithium ions and the EC molecules at the surface of the anode particles, respectively. It is obvious that $c_{EC,R_s}$ is changed according to the kind of the electrolyte solvent.

$\varphi_{e-}$ is regarded as the reference in order to analyze relationship to other potentials. When the battery is charged, the overpotential, $\eta_-$, is negative because $j_-^{Li}$ is negative due to the ion transport from the electrolyte to the anode.

Referring to FIG. 2, when SOC is high, the ion concentration in the anode is high and the equilibrium potential, $U_{eq,-}$, becomes small. Also, $\varphi_{s-}$ also becomes small under the assumption that the overpotential, $\eta_-$, is constant. As shown in FIG. 2, when $\eta_{side}$ decreases, the magnitude of the side reaction rate increases. Consequently, charging the secondary battery 20 in a high SOC range leads to a large rate of side reactions, which eventually accelerates degradation of the secondary battery 20.

Also, when the secondary battery 20 is charged with a high current, the magnitude of the overpotential, $\eta_-$, increases according to the B-V equation, which lowers the anode potential, $\varphi_{s-}$. Since the overpotential for side reactions, $\eta_{side}$, is the difference between the anode potential and the equilibrium potential, the magnitude of the overpotential for the side reactions increases, which leads to a high side reaction rate.

Meanwhile, CC/CV charging and pulse charging are used as classical charging methods. Among two charging methods, the CC/CV charging is the mostly used charging method. When the charging current increases, the charging time may be reduced. However, the charging time is not significantly reduced by a high charging current since it leads to the extension of CV mode. In the CC mode, a higher charging current leads to a quick increase of SOC. However, the terminal voltage reaches the cutoff voltage at a lower SOC. On the other hand, a high charging current leads to a high magnitude of overpotential of the side reactions. Accordingly, the side reaction rate is increased, and the cycle life is significantly reduced. In addition, an increase of the cutoff voltage may also significantly reduce the charging time because the CC charging period is extended and the average charging current in CV mode is also increased. However, the increased cutoff voltage increases the magnitude of the charging current in CC mode that leads to higher magnitude of overpotential of the side reactions, which increases the side reaction rate. In conclusion, increasing the charging current or the cutoff voltage of in the CC/CV charging method is not satisfied with the requirements for fast charging including short charging time and slow degradation speed.

On the other hand, the pulse charging method is another option being widely proposed. The pulse charging method may be categorized into unidirectional pulse charging and bidirectional pulse charging dependent upon the presence of resting or negative pulses. The charging time is determined by the mean value of the pulse charging current. Thus, the charging time cannot be reduced by only increasing the magnitude of the positive pulses. However, resting and negative pulses speed up relaxation of ion concentration gradients and reduction of the concentration overpotential in the anode, which suppresses formation of lithium plating. In addition, the bidirectional pulse charging with optimized frequency may significantly prevent lithium plating because deposited lithium dissolves during discharging and takes part in the main chemical reactions again. However, the bidirectional pulse charging has no positive or even detrimental effects on the performance and cycle life of the secondary battery 20. For pulse current with the frequency larger than 10 Hz, the lithium-ion battery behaves like a low-pass filtering behavior because of the large capacitance of the battery, so the degradation of the battery is determined by the mean value of the pulse charging currents. Also, no differences in charging time and degradation speed between the pulse charging and the CC/CV charging are reported with the pulse frequency of 25 Hz. In addition, when the frequency is less than 10 Hz, pulse current cannot be completely buffered by the large capacitances of the battery, so the ion concentration gradient increases significantly and the anode potential becomes more negative, which increase the side reaction rate significantly.

On the other hand, the pulse charging method generates more heat compared with the CC/CV charging method, which causes a high side reaction rate. When the magnitude of the pulse charging current decreases, the ion concentration gradient and the ion concentration saturation may be effectively reduced. Thus, in the present disclosure, only the pulse charging current with decreased magnitude is employed for the range of high SOC to prevent the ion concentration from exceeding a saturation limit.

In the present disclosure, the charging method is designed in consideration of three parts as follows. First, a model that allows for estimation of physical variables such as the ion concentrations and the anode potentials in real time is provided, and estimation errors caused by model state error and measurement noises are reduced using advanced control. Second, the effects of the CC/CV charging method according to the developed model on the charging time and the degradation speed are analyzed. Third, the magnitude of charging current and the duration of pulses are determined considering different limiting factors.

First, the reduced order model (ROM) according to an embodiment of the present disclosure will be described.

When the lithium-ion battery is charged, lithium ions de-intercalated from the cathode particles are transported through the electrolyte to cause chemical reactions at the interface between the anode particles and electrolyte, and are finally intercalated into the anode particles. During this process, the electrons are transported through an external circuit. Similarly, reverse reactions are performed during discharging. This electrochemical process may be described mathematically using electrochemical, thermal and mechanical principles. The electrochemical principles include mass transport and electrochemical kinetics, and the thermal and mechanical principles are based on energy equations and mechanical stress-strain relationships.

Physical variables indicating the behavior of ions during the operation of the lithium-ion battery cannot be measured experimentally. One potential approach is to develop a model with governing equations that can estimate the physical variables through numerical analysis.

In addition, if degradation mechanisms are further combined, the model may predict the performance of the battery in a beginning of life (BOL) state, a middle of life (MOL) state and an end of life (EOL) state. Depending on the degree of the order, the model may be called a reduced low order model or a full order model.

A pouch-type lithium ion cell is made of stacked micro cells that are aggregated in a rolled or sandwiched form. If there is no difference in electrochemical characteristics among a plurality of micro cells, it may be assumed that one micro cell represents the behavior of the entire micro cells.

The micro cell has a sandwich structure in which a separator is interposed between the anode and the cathode in the thickness direction. The active materials of the lithium ion battery are made of metal oxides for the cathode and carbon for the anode. The shapes of the active materials are approximated with a spherical shape that are distributed uniformly in the space occupied by the active material layers. A schematic diagram of the single microcell cell is depicted in FIG. 3.

Figure 3:
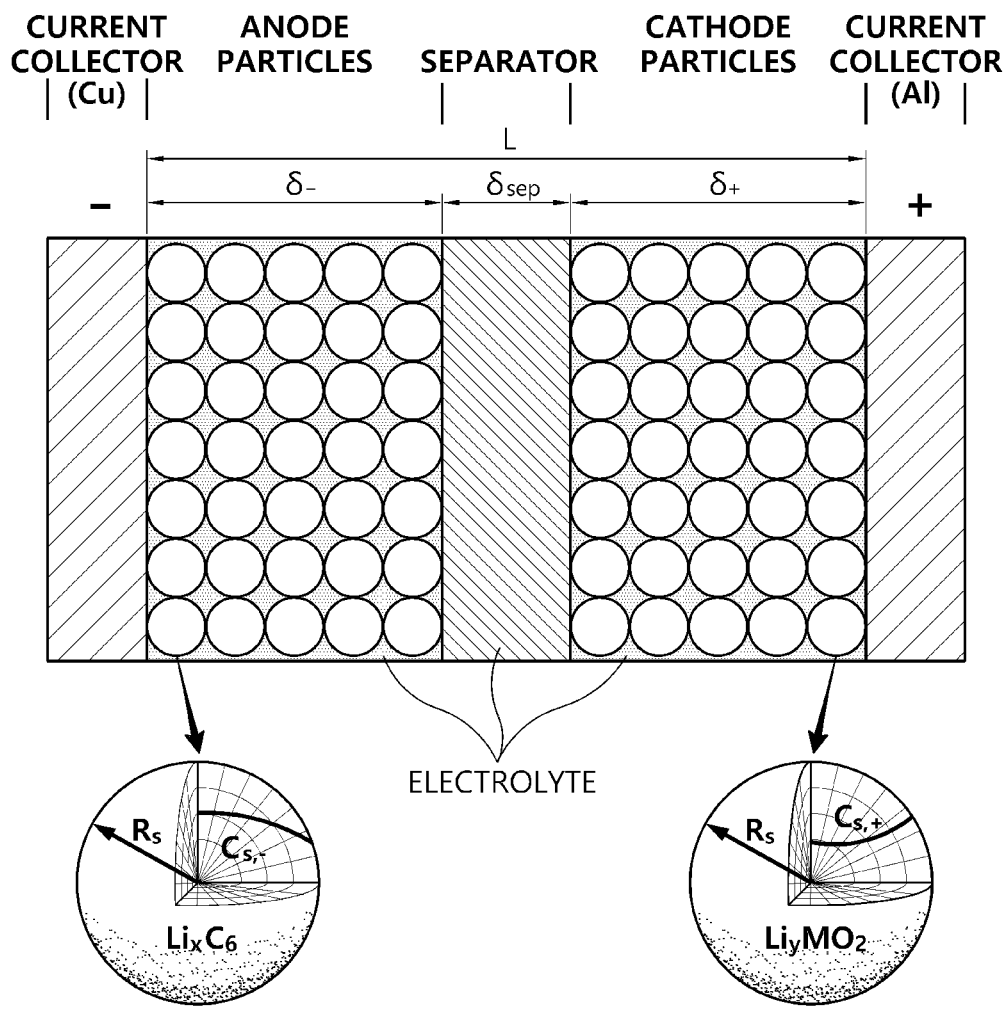
FIG. 3 is a schematic diagram showing a single micro cell used in a reduced order model (ROM) according to the present disclosure.

Referring to FIG. 3, when the micro cell is discharged or charged, lithium ions are de-intercalated from a lattice structure of the active material particle of any one electrode, then diffused to the surface of the active material particle, and then transported through the electrolyte and the separator to the surface of the active material particle of the other electrode. The transported lithium ions chemically react with electrons at the surface of the active material particle of the other electrode, then diffuse into the active material particles, and are intercalated into the lattice structure again. The electrons flow through an external circuit and complete the redox process.

The governing equations for the electrochemical principles including intercalation or de-intercalation of lithium ions, diffusion, ion transport, chemical reactions and resulting change of potentials are listed Table 1. The meanings of the variables and parameters of the governing equations may be understood from the Nomenclature defined in the beginning of the specification.

TABLE 1

[Summary of full order model and reduced order model]

| Cell dynamics | FOM | ROM |
|---|---|---|
| Ion concentration in electrode | $\frac{\partial c_s}{\partial t} = \frac{D_s}{r^2}\frac{\partial}{\partial r}\left(r^2 \frac{\partial c_s}{\partial r}\right)$ | $\frac{d}{dt}c_{s,ave} + 3\frac{j^{Li}}{R_s a_s F} = 0$ |
| | $\frac{1}{r}\frac{\partial c_s}{\partial r}\bigg|_{r=0} = 0$ and $D_s \frac{\partial c_s}{\partial r}\bigg|_{r=R_s} = \frac{-j^{Li}}{a_s F}$ | $\frac{d}{dt}q_{ave} + 30\frac{D_s}{R_s^2}q_{ave} + \frac{45}{2}\frac{j^{Li}}{2R_s^2 a_s F} = 0$ |
| | | $35\frac{D_s}{R_s}(c_{s,surf} - c_{s,ave}) - 8D_s q_{ave} = -\frac{j^{Li}}{a_s F}$ |
| Ion concentration in electrolyte | $\frac{\partial(\varepsilon_e c_e)}{\partial t} = \frac{\partial}{\partial x}\left(D_e^{eff}\frac{\partial}{\partial x}c_e\right) + \frac{1-t_+^0}{F}j^{Li}$ | $\dot{c}_e = A^* \cdot c_e + B^* \cdot I$<br>$y = C^* \cdot c_e + D^* \cdot I$ |
| | $\frac{\partial c_e}{\partial x}\bigg|_{x=0} = \frac{\partial c_e}{\partial x}\bigg|_{x=L} = 0$ | |
| Ohm's law in electrode | $\frac{\partial}{\partial x}\left(\sigma^{eff}\frac{\partial}{\partial x}\varphi_s\right) - j^{Li} = 0$ | $\frac{\partial}{\partial x}\left(\frac{\partial}{\partial x}\varphi_s\right) = \frac{j^{Li}}{\sigma^{eff}}$ |
| | $-\sigma^{eff}\frac{\partial}{\partial x}\varphi_s\bigg|_{x=0} = -\sigma^{eff}\frac{\partial}{\partial x}\varphi_s\bigg|_{x=L} = \frac{I}{A}$ | $-\sigma^{eff}\frac{\partial}{\partial x}\varphi_s\bigg|_{x=0} = -\sigma^{eff}\frac{\partial}{\partial x}\varphi_s\bigg|_{x=L} = \frac{I}{A}$ |
| | $\frac{\partial}{\partial x}\varphi_s\bigg|_{x=\delta_-} = \frac{\partial}{\partial x}\varphi_s\bigg|_{x=\delta_-+\delta_{sep}} = 0$ | $\frac{\partial}{\partial x}\varphi_s\bigg|_{x=\delta_-} = \frac{\partial}{\partial x}\varphi_s\bigg|_{x=\delta_-+\delta_{sep}} = 0$ |

TABLE 1-continued

[Summary of full order model and reduced order model]

| Cell dynamics | FOM | ROM |
|---|---|---|
| Ohm's law in electrode | $\frac{\partial}{\partial x}\left(\kappa^{\mathit{eff}} \frac{\partial}{\partial x}\varphi_e\right) + \frac{\partial}{\partial x}\left(\kappa_D^{\mathit{eff}} \frac{\partial}{\partial x}\ln c_e\right) + j^{Li} = 0$ <br><br> $\frac{\partial}{\partial x}\varphi_e\bigg|_{x=0} = \frac{\partial}{\partial x}\varphi_e\bigg|_{x=L} = 0$ | $\frac{\partial}{\partial x}\left(\frac{\partial}{\partial x}\varphi_e\right) + \frac{j^{Li}}{\kappa^{\mathit{eff}}} = 0$ <br><br> $\frac{\partial}{\partial x}\varphi_e\bigg|_{x=0} = \frac{\partial}{\partial x}\varphi_e\bigg|_{x=L} = 0$ |
| Electrochemical kinetics | $j^{Li} = a_s i_0 \left\{\exp\left[\frac{\alpha_c nF}{RT}\eta\right] - \exp\left[\frac{\alpha_c nF}{RT}\eta\right]\right\}$ | $j^{Li} = a_s i_0 \frac{n(\alpha_a + \alpha_c)F}{RT}\eta$ |
| SOC | $SOC = \frac{1}{\delta_-}\int_0^{\delta_-} \frac{(c_{s,ave} - c_{s,max} Stoi_{100})}{c_{s,max}(Stoi_{100} - Stoi_0)}$ | |

Four partial differential equations (PDEs) listed in Table 1 describe physical variables depending on time and location. The physical variables include (1) an ion concentration ($c_s$) in the active material particles derived from Fick's law that is a diffusion law of spherical particles, (2) an ion concentration ($c_e$) in the electrolyte based on the preservation of lithium ions, (3) a potential ($\varphi_s$) in the active material layer derived from the ohm's law, (4) a potential ($\varphi_e$) in the electrolyte calculated using Kirchoff's law and ohm's law, and (5) a B-V equation describing electrochemical kinetics in the reaction interface.

Although accurate calculations of ion behavior during the operation of lithium-ion battery are possible, the full order model (FOM) shown at the left side of Table 1 is limited in its application because of its high computational load. The full order model is simplified to a reduced order model, called Pseudo-2D-ROM, where the electrodes are assumed to be composed of spherical particles with the same radius, which are in contact with each other. The two dimensions imply calculation of ion concentration in the particles and through the plane.

To solve the partial differential equations of the P2D-ROM, several other numerical analysis methods such as finite difference method (FDM), finite-element method (FEM) and finite-volume method (FVM) are available.

The P2D-ROM has two parts, and the calculation of ion concentration in the electrode and the electrolyte may be simplified by applying a polynomial approximation method and a state-space method, respectively. The computation time of the simplified P2D-ROM is reduced to one-sixth of the FOM computation time while the overall model accuracy is maintained. The equation for the simplified P2D-ROM is shown at the right side in Table 1. Hereinafter, unless otherwise stated, the reduced order model (ROM) refers to the simplified P2D-ROM.

A detailed description of the reduced order model for the FOM may be found in X. Li, M. Xiao, and S. Y. Choe. "Reduced order model (ROM) of a pouch type lithium polymer battery based on electrochemical thermal principles for real time applications." Electrochimica Acta 97 (2013): 66-78. In an embodiment of the present disclosure, model parameters used in the P2D-ROM are listed in Table 2 below. The model parameters are stored in the memory unit 130 in advance.

TABLE 2 model parameter

| Category | Parameter | Negative electrode | Separator | Positive electrode |
|---|---|---|---|---|
| Design specifications (geometry and volume fractions) | Thickness, $\delta$ (cm) | $50*10^{-4}$ | $25.4*10^{-4}$ | $36.4*10^{-4}$ |
| | Particle radius, $R_s$ (cm) | $1*10^{-4}$ | | $1*10^{-4}$ |
| | Active material volume ratio, $\varepsilon_s$ | 0.58 | | 0.5 |
| | Polymer phase volume ratio, $\varepsilon_p$ | 0.048 | 0.5 | 0.11 |
| | Conductive filler volume ratio, $\varepsilon_f$ | 0.04 | | 0.06 |
| | Porosity, $\varepsilon_e$ | 0.332 | 0.5 | 0.33 |
| Lithium ion concentration | Maximum solid phase temperature, $c_{s,max}$ (mol cm$^{-3}$) | $16.1*10^{-3}$ | | $23.9*10^{-3}$ |
| | Stoichiometry at 0% SOC, Stoi0 | 0.126 | | 0.936 |
| | Stoichiometry at 100% SOC, Stoi100 | 0.676 | | 0.442 |
| | Average electrolyte concentration, $c_e$ (mol cm$^{-3}$) | $1.2*10^{-3}$ | $1.2*10^{-3}$ | $1.2*10^{-3}$ |
| Kinetic and transport properties | Exchange current density coefficient, $k_{i0}$ (A cm$^{-2}$) | 12.9 | | 6.28 |
| | Charge-transfer coefficient, $\alpha_a$, $\alpha_c$ | 0.5, 0.5 | | 0.5, 0.5 |
| | Solid phase conductivity, $\sigma$ (S cm$^{-1}$) | 1 | | 0.1 |
| | Electrolyte phase Li$^+$ diffusion coefficient, $D_e$ (cm$^2$ s$^{-1}$) | $2.6*10^{-6}$ | $2.6*10^{-6}$ | $2.6*10^{-6}$ |
| | Slid phase Li$^+$ diffusion coefficient, $D_{s,0}$ (cm$^2$ s$^{-1}$) | $3*10^{-12}$ | | $5.55*10^{-12}$ |

TABLE 2-continued

| | | model parameter | | |
|---|---|---|---|---|
| Category | Parameter | Negative electrode | Separator | Positive electrode |
| | Activation energy of $D_s$, $E_{a,D}$ (J mol$^{-1}$) | $4.5*10^4$ | | $4.5*10^4$ |
| | Film resistance of SEI layer, $R_{SEI,0}$ ($\Omega$ cm$^2$) | 1000 | | |
| | Activation energy of $R_{SEI}$, $E_{a,R}$ (J mol$^{-1}$) | $3.8*10^4$ | | |
| | Bruggeman's posority exponent, p | 1.5 | 1.5 | 1.5 |
| | Electrolyte phase ionic conductivity, $\kappa$ (S cm$^{-1}$) | $15.8c_e$ exp($-13472c_e^{1.4}$) | | $15.8c_e$ exp($-13472c_e^{1.4}$) |
| | Li$^+$ transference number, $t_+^0$ | 0.363 | 0.363 | 0.363 |
| Equilibrium potential | Negative electrode (V) | $U_-(x) = 8.00229 + 5.0647x - 12.578x^{1/2} - 8.6322 \times 10^{-4}x^{-1} + 2.1765 * 10-5x^{3/2} - 0.46016 * \exp(15 * (0.06 - x)) - 0.55364 * \exp(-2.4326 * (x - 0.92))$. where $x = c_{s,surf}/c_{s,max}$ | | |
| | Positive electrode (V) | The difference between OCV and the equilibrium potential of the negative electrode | | |
| side reaction | Equilibrium potential of side reaction, $U_{eq,side}$ (V) | 0.4 | | |
| | Kinetic rate constant for side reactions, $k_{side}$ (A cm mol$^{-1}$) | $3.07*10^{-6}$ | | |
| | Cathode symmetric factor of side reactions, $\alpha_{c,side}$ | 0.7 | | |

Referring to FIG. 1 again, the control unit 120 determine the internal states of the secondary battery, including the average ion concentration ($c_{s,ave}$) of the anode, the anode potential ($\varphi_{s-}$), the electrolyte potential ($\varphi_{e-}$) of the anode, the surface ion e concentration ($c_{s,surf}$) of the anode and the volume-averaged concentration fluxes ($q_{ave}$) of the anode, by using the equations of the reduced order model defined in the Table 1. Here, $c_{s,ave}$, $\varphi_{s-}$, $c_{s,surf}$ and $q_{ave}$ are for the active material particles in solid phase.

The control unit 120 also determines the state of charge (SOC) of the secondary battery from the average ion concentration ($c_{s,ave}$) of the anode particles by using the SOC calculation equation in Table 1. For the parameter values included in the SOC calculation equation, the predefined data shown in Table 2 are referred to.

The control unit also determines the side reaction rate ($j_{side}^{Li}$) using Equations (3) to (7) from the internal state of the secondary battery 20, which is calculated from the reduced order model. For the parameters included in the equation for calculating the side reaction rate ($j_{side}^{Li}$), the predefined data shown in Table 2 are referred to.

The control unit 120 also determines whether a charging current control condition, namely (i) whether the measured voltage value reaches the cutoff voltage, (ii) whether the surface ion concentration of the anode particles reaches its upper limit concentration or (iii) the side reaction rate reaches its upper limit rate, is satisfied.

Also, if any of the charging current control conditions is required, the control unit 120 reduces the magnitude of the charging current applied to the charging of the secondary battery 20. The control unit 120 transmits a current adjustment message including the reduced charging current information to the charger 2 through the communication unit 140 to reduce the magnitude of the charging current applied to the secondary battery 20 by the charger 2. If the charger 2 receives the current adjustment message from the control unit 120, the charger 2 reduces the magnitude of the charging current with reference to the reduced charging current information included in the message.

Figure 13:
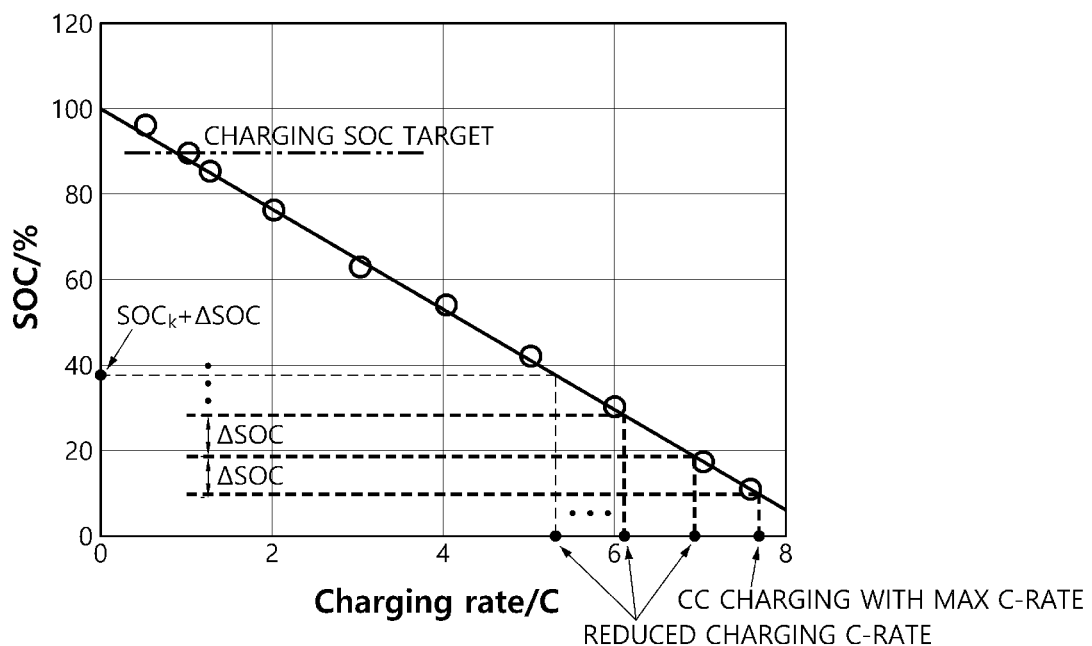
FIG. 13 is a graph for conceptually illustrating the reduction of charging current according to an embodiment of the present disclosure.

For example, as shown in FIG. 13, the control unit 120 refers to the profile defining the magnitude of the charging current according to the SOC, identifies a current, which corresponds to the sum (SOC$_k$+$\Delta$SOC) of the SOC (SOC$_k$) at the present time when the charging current control condition is satisfied and the preset SOC variation amount ($\Delta$SOC), from the profile, and determines the identified current as the reduced charging current.

Also, if the reduced charging current is determined, the control unit 120 transmits a current adjustment message including the reduced current information to the charger 2 through the communication unit 140. Then, the charger 2 adjusts the magnitude of the charging current according to the reduced current information and applies the adjusted charging current to the secondary battery 20.

Preferably, the current is adjusted repeatedly whenever the above condition is satisfied.

Meanwhile, the control unit 120 may repeatedly perform time update and measurement update for the internal state of the secondary battery 20 by using the extended Kalman filter so that the difference between the voltage of the secondary battery 20 estimated by the ROM and the measured voltage value measured through the voltage measuring means 112 is minimized The reduced order model combined with the extended Kalman filter is hereinafter referred to as ROM-EKF.

According to an embodiment of the present disclosure, the control unit 120 may be configured to repeatedly perform time update and measurement update for the internal state of the secondary battery using the extended Kalman filter, in which the state-space equation for the internal states of the secondary battery which includes the average ion concentration ($c_{s,ave}^k$) of the anode particles, the volume-averaged concentration fluxes ($q_{ave}^k$) of the anode particles and the surface ion concentration ($c_{s,surf}^k$) of the anode particles, and the output equation for the voltage of the secondary battery is defined as below, such that the difference between the estimated voltage ($V_t$) and the measured voltage value of the secondary battery is minimized The state-space equation and the output equation are derived from the ROM and are defined using a discrete time model. $\Delta t$ is the sampling time period in which time update and measurement update are repeated for the internal state of the secondary battery, and k and k−1 are time indexes.

[Discrete Equation]

$$c_{s,ave}^k = c_{s,ave}^{k-1} - 3\frac{j^{Li,k}\Delta t}{R_s a_s F}$$

-continued $$q_{ave}^k - q_{ave}^{k-1} = -30\frac{D_s \Delta t}{R_s^2} q_{ave}^{k-1} - \frac{45}{2}\frac{j^{Li,k} \Delta t}{R_s^2 a_s F}$$

$$c_{z,zwf}^k = c_{s,ave}^k + \frac{8 R_s q_{ave}^k}{35} - \frac{R_s j^{Li,k}}{35 D_s a_s F}$$

[Discrete State-Space Equation]

$$\begin{bmatrix} c_{s,ave}^k \\ q_{ave}^k \end{bmatrix} = \begin{bmatrix} 1 & 0 \\ 0 & 1-30\frac{D_s \Delta t}{R_s^2} \end{bmatrix} \begin{bmatrix} c_{s,ave}^{k-1} \\ q_{ave}^{k-1} \end{bmatrix} + \begin{bmatrix} \frac{-3\Delta t}{R_s a_s F} \\ \frac{-45\Delta t}{2 R_s^2 a_s F} \end{bmatrix}$$

($c_{s,ave}$: average ion concentration of anode particles, $c_{s,surf}$: surface ion concentration of anode particles, $q_{ave}$: volume-averaged concentration fluxes of anode particles, $j^{Li}$: lithium reaction rate, $a_s$: specific surface area of an electrode, F: Faraday constant, $D_s$: diffusion coefficient of anode particles, $R_s$: radius of spherical electrode particle, $\Delta t$: update interval)

[Output Equation]

$$V_t = \varphi_s^+ - \varphi_s^- - R_{film} I$$

$$\eta = \varphi_s - \varphi_e + U_{eq}(c_{s,surf}) + \frac{R_{film}}{a_s} j^{Li}$$

($V_t$: voltage, $\varphi_s^+$: solid phase potential of a cathode, $\varphi_s^-$: solid phase potential of an anode, $\varphi_e$: electrolyte potential, $U_{eq}$: equilibrium potential, $\eta$: surface overpotential of an electrode, $c_{s,surf}$: surface ion concentration of a solid phase particle, $R_{film}$: ohmic resistance in battery, I: current, A: cell area, $R_{SEI}$: SEI resistance, $a_s$: specific surface area of an electrode, $j^{Li}$: lithium reaction rate)

The output equation may be re-defined as follows to calculate the Jacobian applied to the extended Kalman filter. Here, it may be understood that the terminal voltage is a function of the surface concentration of solid phase particles. $U^p$ and $U^n$ are equilibrium potentials of the cathode and the anode.

$$V_t = \eta^+ - \eta^- + \varphi_e^+ - \varphi_e^- + U^p(c_{s,surf}^+) - U^n(c_{s,surf}^-) - \frac{R_{SEI} A}{a_s} j^{Li} - R_{film} I$$

According to an embodiment of the present disclosure, when repeatedly performing time update and measurement update for the internal state of the secondary battery using the extended Kalman filter, the Jacobian defined by the following equation may be applied.

[Jacobian]

$$H_k = \frac{dVt_k}{dx_k} = [H_{1,k} \; H_{2,k} \; H_{3,k} \; H_{4,k}]$$

$$H_{1,k} = -\left(\frac{dU^n}{dc_{s,surf}^-}\right)_k \left(\frac{dc_{s,surf}^-}{dc_{s,ave}^-}\right)_k = -\left(\frac{dU^n}{dc_{s,surf}^-}\right)_k,$$

$$H_{2,k} = -\left(\frac{dU^n}{dc_{s,surf}^-}\right)_k \left(\frac{dc_{s,surf}^-}{dq_{me}^-}\right)_k = -\left(\frac{dU^n}{dc_{s,surf}^-}\right)_k \frac{8R_s^-}{35}$$

$$H_{3,k} = \left(\frac{dU^p}{dc_{s,surf}^+}\right)_k \left(\frac{dc_{s,surf}^+}{dc_{s,ave}^+}\right)_k = \left(\frac{dU^p}{dc_{s,surf}^+}\right)_k,$$

$$H_{4,k} = \left(\frac{dU^p}{dc_{s,surf}^+}\right)_k \left(\frac{dc_{s,surf}^+}{dq_{me}^+}\right)_k = \left(\frac{dU^p}{dc_{s,surf}^+}\right)_k \frac{8R_s^+}{35}$$

Figure 4:
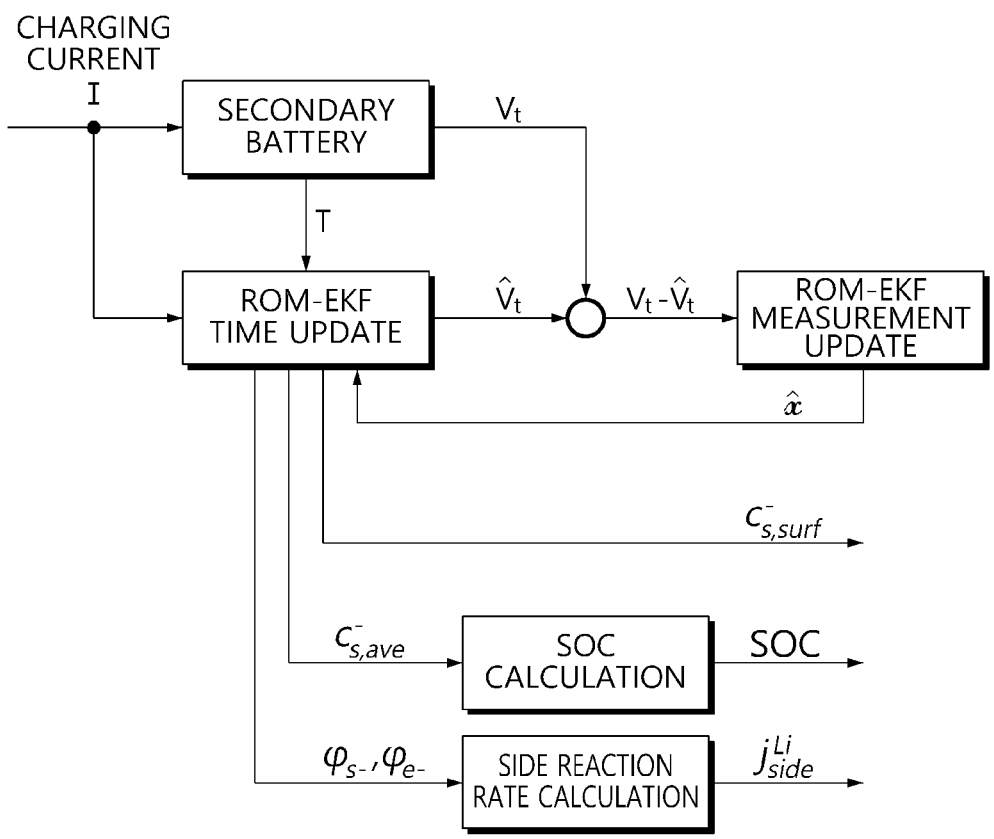
FIG. 4 is a block diagram showing a reduced order model combined with an extended Kalman filter, namely ROM-EKF.

FIG. 4 is a block diagram showing a reduced order model combined with an extended Kalman filter, namely ROM-EKF. Referring to FIG. 4, the SOC is a ratio between the maximum number of ions that can be present in the active material particles and the number of ions that exist at the present. At any moment, the number of ions existing in the active material particles may be calculated based on the average ion concentration in the active material particles.

The dynamic error of the average ion concentration and the error of the SOC given by an initial value may further improved by the closed loop correction using the extended Kalman filter.

The control unit 120 predicts the internal states ($c_{s,surf}^-$, $c_{s,ave}^-$, $q_{ave}$) of the secondary battery 20 using the state-space equation of the extended Kalman filter. In addition, the control unit 120 determines the SOC, namely the state of charge of the secondary battery 20, using the SOC calculation equation shown in Table 1 with the average ion concentration ($c_{s,ave}^-$) of the anode particles among the predicted internal states of the secondary battery 20. Also, the control unit 120 determines the solid phase potential ($\varphi_{s-}$) of the anode particles and the electrolyte potential ($\varphi_{s-}$) of the anode among the internal states of the secondary battery 20 using the ROM, and determines the side reaction rate ($j_{side}^{Li}$) of the secondary battery 20. In addition, the control unit 120 determines the estimated voltage ($\hat{V}_t$) of the secondary battery using the output equation of the extended Kalman filter, and corrects the internal states ($c_{s,surf}^-$, $c_{s,ave}^-$, $q_{ave}$) of the secondary battery 20 according to the difference between the estimated voltage ($\hat{V}_t$) and the measured voltage ($V_t$).

If the state-space equation, the output equation and the Jacobian of the extended Kalman filter are defined, the time update and measurement update processes for the internal states of the secondary battery 20 is automatically executed using an extended Kalman filter algorithm known in the art, and this is not described in detail here.

Hereinafter, a charging method performed by the charging apparatus of a secondary battery above will be described with reference to a flowchart.

Figure 5:
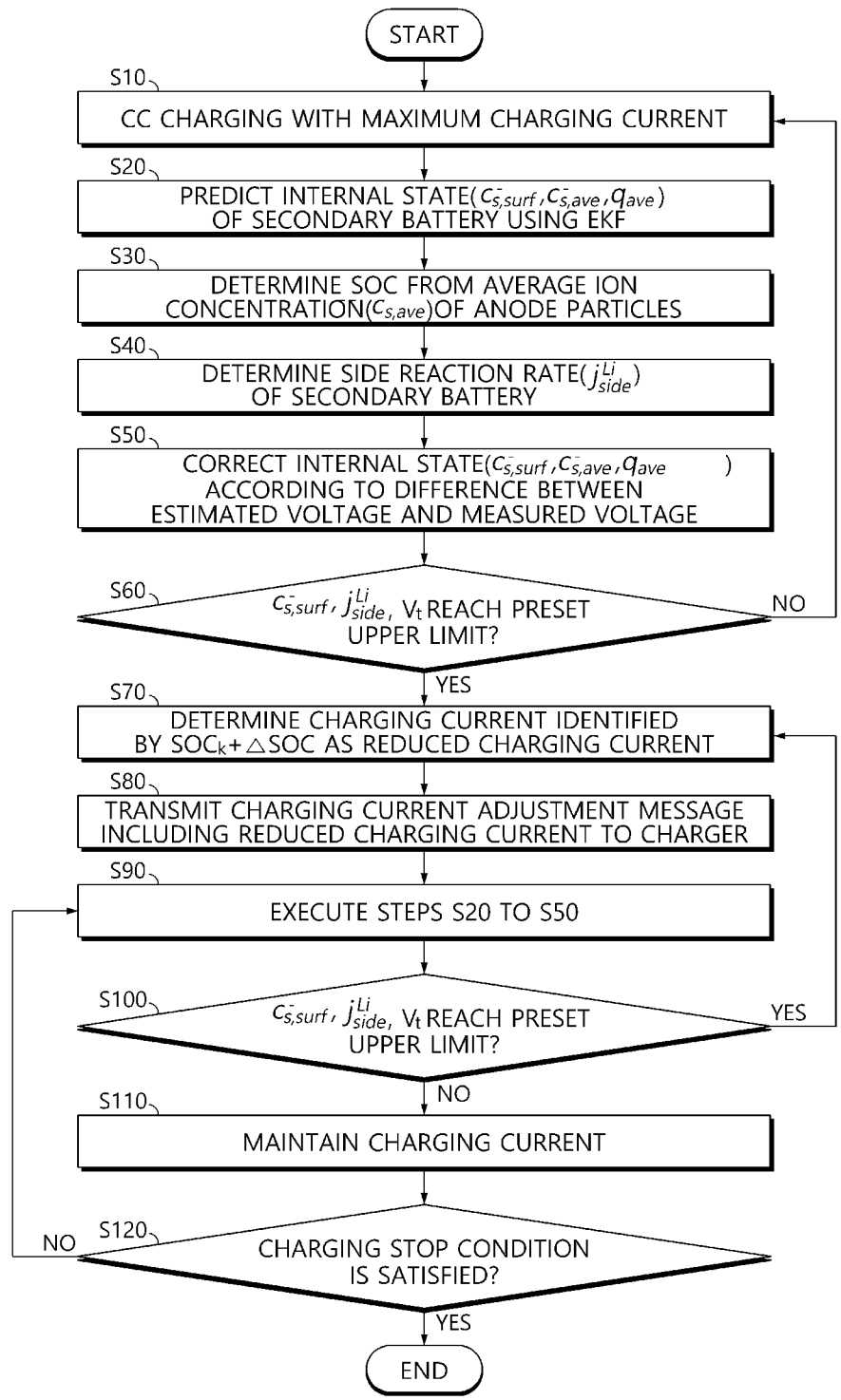
FIG. 5 is a flowchart for illustrating a charging method of a secondary battery according to an embodiment of the present disclosure.

FIG. 5 is a flowchart for illustrating a charging method of a secondary battery according to an embodiment of the present disclosure.

First, in Step S10, the control unit 120 determines the magnitude of the charging current of the secondary battery 20 as a maximum value, and transmits a current adjustment message including the maximum charging information to the charger 2 through the communication unit 140 to start charging the secondary battery 20. Here, the maximum value of current is determined in advance according to the specification of the secondary battery 20 and refers to the information previously stored in the memory unit 130.

If the charger 2 receives the current adjustment message including the maximum charging information from the control unit 120, the charger 2 applies a charging current corresponding to the maximum charging current to the secondary battery 20 to start constant current charging.

In Step S20, if charging of the secondary battery 20 is started, the control unit 120 predicts the internal states ($c_{s,surf}^-$, $c_{s,ave}^-$, $q_{ave}$) of the secondary battery 20 using the state-space equation of the extended Kalman filter.

In Step S30, the control unit 120 determines the state of charge (SOC) of the secondary battery 20 from the average ion concentration ($c_{s,ave}^-$) of the anode particles using the SOC calculation equation.

In Step S40, the control unit 120 determines the solid phase potential ($\varphi_{s-}$) and electrolyte potential ($\varphi_{s-}$) of the anode particles among the internal states of the secondary battery 20 using the ROM, and determines the side reaction rate of ($j_{side}^{Li}$) of the secondary battery 20 using Equations (3) to (7).

In Step S50, the control unit 120 determines the estimated voltage ($\hat{V}_t$) of the secondary battery using the output equation of the extended Kalman filter, and corrects the internal states ($c_{s,surf}^-$, $c_{s,ave}^-$, $q_{ave}$) of the secondary battery 20 according to the difference between the estimated voltage ($\hat{V}_t$) and the measured voltage ($V_t$).

In Step S60, the control unit 120 determines whether a charging current control condition, namely (i) whether the measured voltage value ($V_t$) reaches the cutoff voltage, (ii) whether the surface ion concentration ($c_{s,surf}^-$) of the anode particles reaches its upper limit concentration or (iii) the side reaction rate ($j_{side}^{Li}$) reaches its upper limit rate, is satisfied.

In Step S60, if it is determined that the charging current control condition is not satisfied, the control unit 120 maintains the magnitude of the charging current. On the other hand, if it is determined that the charging current control condition is satisfied, the control unit 120 proceeds to Step S70.

In Step S70, the control unit 120 reduces the magnitude of the charging current. Specifically, the control unit 120 identifies a charging current, which corresponds to the sum ($SOC_k + \Delta SOC$) of the SOC (i.e., $SOC_k$) at the present time and the preset SOC variation amount ($\Delta SOC$), with reference to the profile (FIG. 13) defining the correlation between the magnitude of the current and the SOC, and determines the identified current as the reduced current. The data related to the profile is stored in the memory unit 130 in advance, and the magnitude of the charging current decreases as SOC increases as shown in FIG. 13.

In Step S80, the control unit 120 transmits a current adjustment message including the reduced current to the charger 2 through the communication unit 140. Then, the charger 2 applies a current corresponding to the reduced current to the secondary battery 20.

In Step S90, if the charging current corresponding to the reduced current is applied to the secondary battery 20, the control unit 120 predicts the internal states ($c_{s,surf}^-$, $c_{s,ave}^-$, $q_{ave}$) of the secondary battery 20 using the state-space equation of the extended Kalman filter as in Step S20. In addition, the control unit 120 determines the state of charge of the secondary battery 20 as in Step S30. Also, the control unit 120 determines the solid phase potential ($q_{s-}$) and electrolyte potential ($\varphi_{s-}$) of the anode particles using the reduced order model as in Step S40, and determines the side reaction rate ($j_{side}^{Li}$) of the secondary battery 20 using Equations (3) to (7). In addition, the control unit 120 determines the estimated voltage ($\hat{V}_t$) of the secondary battery using the output equation of the extended Kalman filter as in Step S50, and corrects the internal states ($c_{s,surf}^-$, $c_{s,ave}^-$, $q_{ave}$) of the secondary battery 20 according to the difference between the estimated voltage ($\hat{V}_t$) and the measured voltage ($V_t$).

In Step S100, the control unit 120 determines whether a charging current control condition, namely (i) whether the measured voltage value ($V_t$) reaches the cutoff voltage, (ii) whether the surface ion concentration ($c_{s,surf}^-$) of the anode particles reaches its upper limit concentration or (iii) the side reaction rate ($j_{side}^{Li}$) reaches its upper limit rate, is satisfied.

In Step S100, if it is determined that the charging current control condition is not satisfied, the control unit 120 proceed to Step S110 to maintain the magnitude of the charging current. On the other hand, if it is determined that the charging current control condition is satisfied, the control unit 120 proceeds to Step S70 to reduce the magnitude of the charging current.

Meanwhile, after Step S110, the control unit 120 determines whether the charging stop condition is satisfied in Step S120. The charge stop condition is satisfied when the SOC of the secondary battery reaches a target value. The target value may be set before charging starts. For example, the target value is 100% SOC. In some cases, the target value may be set lower than 100% SOC.

In Step S120, if the charging stop condition is satisfied, the control unit 120 ends charging of the secondary battery 20. However, if the charging stop condition is not satisfied, the control unit 120 proceeds to Step S90 to continue charging. Thus, the magnitude of the charging current is repeatedly reduced whenever the charging current control condition is satisfied, until the charging stop condition is satisfied.

Example

The secondary battery used in the example of the present disclosure is a pouch-type lithium-ion battery having a capacity of 15.7 Ah. The active materials of the anode and the cathode are graphite and NMC ($Li[MnNiCo]O_2$), respectively. The ROM-EKF is validated against the experimental data obtained during charging and discharging of the secondary battery. The magnitude of the charging current is adjusted to 1C, 2C, 3C, 4C, 5C and 6C at room temperature 25° C. Even at a high current, the temperature of the secondary battery is kept constant by a calorimeter designed in the laboratory. By doing so, the effects of the temperature on the charging and discharging characteristics are limited.

[Evaluation of the Terminal Voltage of the Secondary Battery]

Figure 6A:
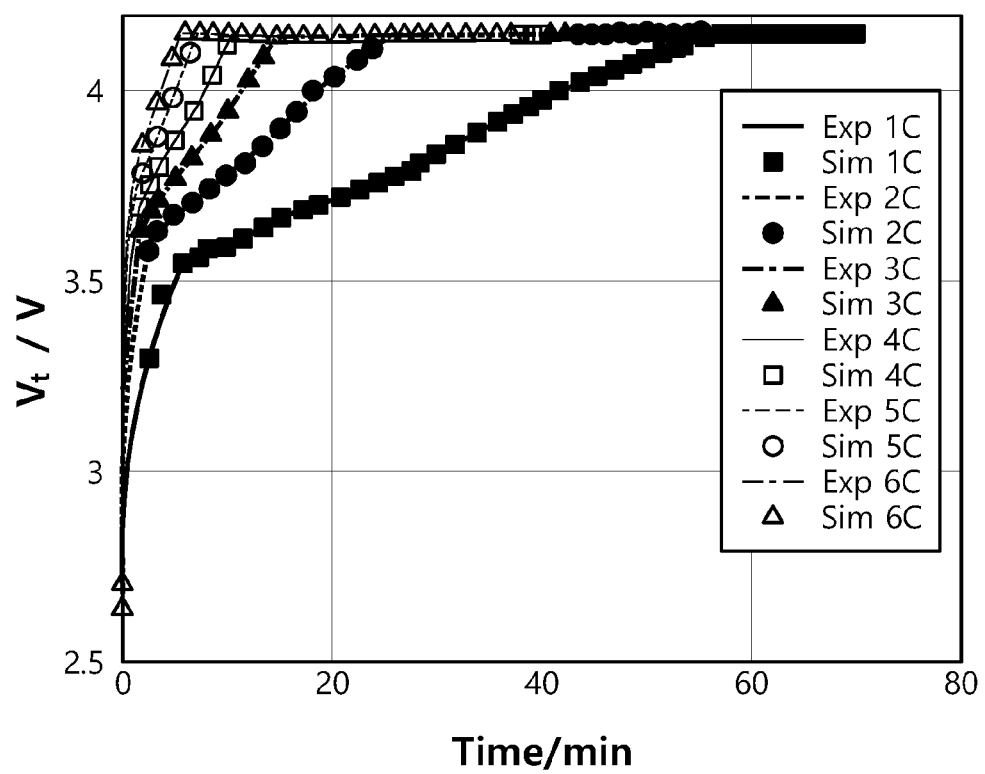
FIGS. 6a and 6b are graphs showing a simulated terminal voltage and a measured terminal voltage of the secondary battery together.
Figure 6B:
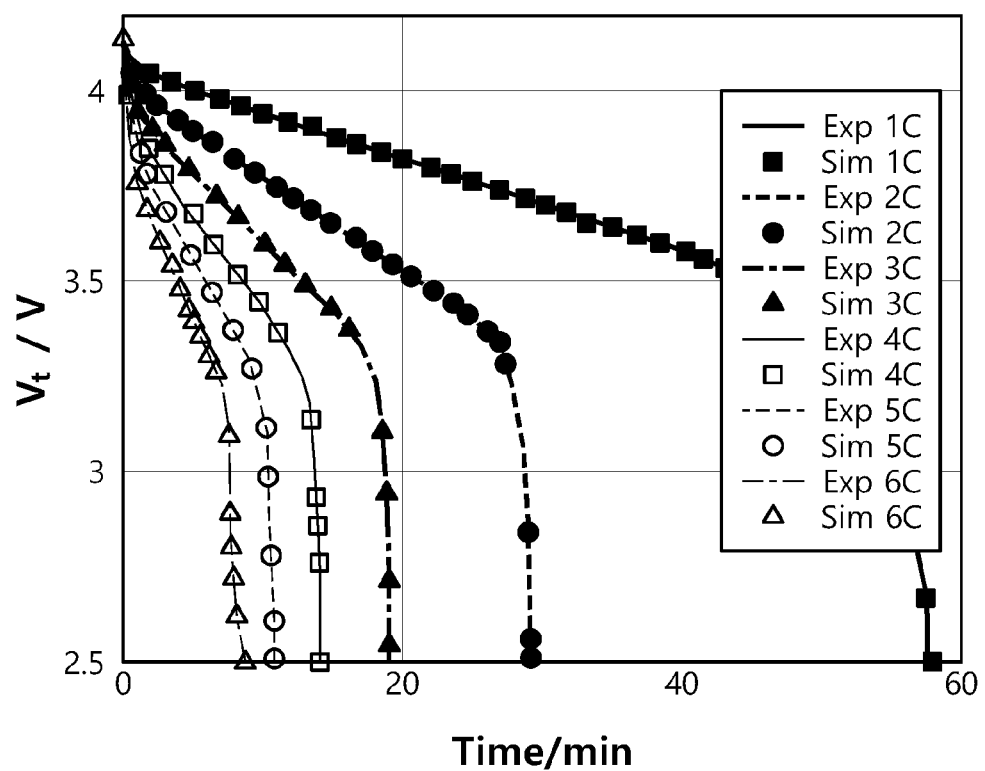

FIG. 6a shows a simulated terminal voltage and an experimental terminal voltage when the lithium secondary battery is charged, and FIG. 6b shows a simulated terminal voltage and an experimental terminal voltage when the lithium secondary battery is discharged. In FIGS. 6a and 6b, a square/circle/triangle plottings and a solid/dashed line represent simulation data and experimental data, respectively. The results show that the terminal voltage estimated by the ROM-EKF is in a fairly good match with the experimental data.

Figure 7A:
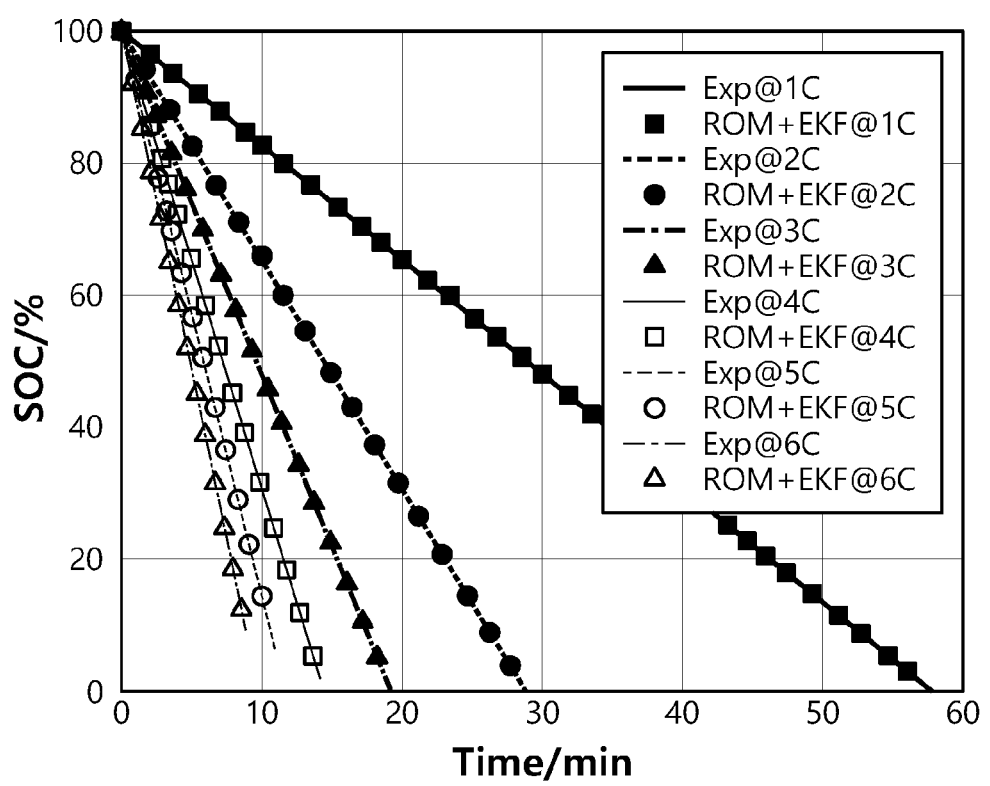
FIGS. 7a and 7b are graphs showing tacking performance of the extended Kalman filter in estimation of SOC according to the present disclosure.
Figure 7B:
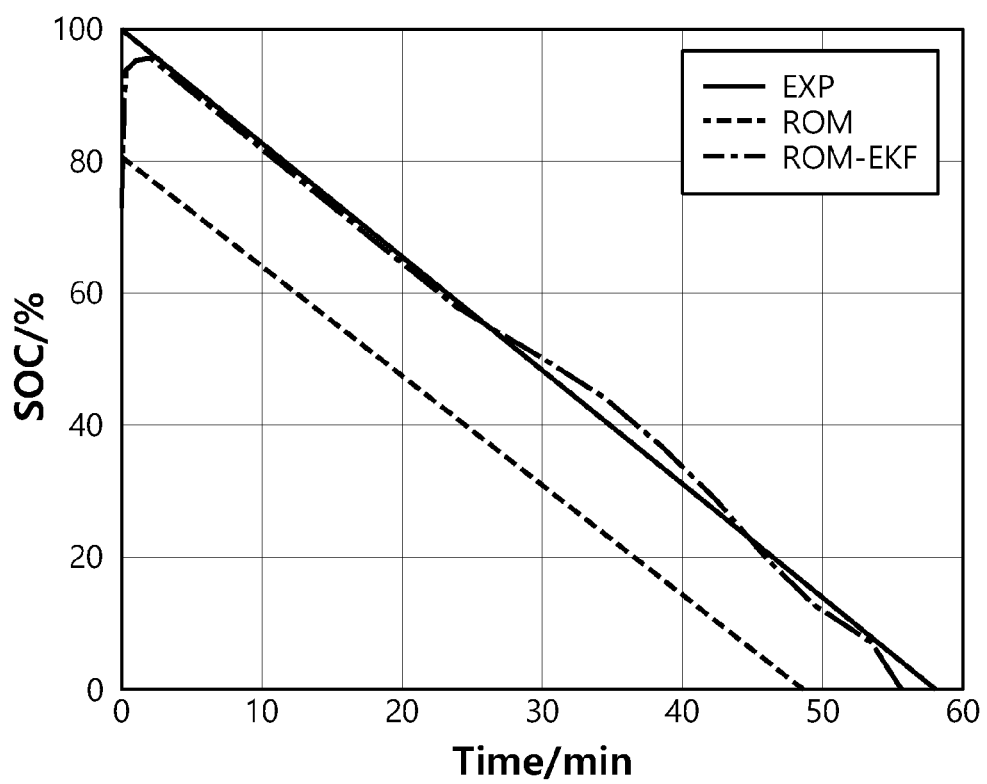

In addition, tracking performance of the extended Kalman filter for estimation of SOC is tested for two cases, and their results are shown in FIGS. 7a and 7b. FIG. 7a is a graph showing the change of SOC according to the magnitude of charging current and time, and FIG. 7b is a graph showing the tracking performance of the extended Kalman filter when there is an initial SOC error. As shown in the figures, in one case, there is an initial SOC error, and in the other case, there is no initial SOC error. If no initial error is present, the ROM-EKF may estimate the SOC with an absolute error that is less than 5%. Also, even with 20% initial SOC error, the ROM-EKF is capable of tracking the SOC within 100 ms.

Meanwhile, even though there is a little bit of overshoot, this overshoot may be optimized by proper selection of the error covariance matrices of the EKF.

[Effects of CC/CV Charging on the Charging Time]

The CC/CV charging method is the simplest and widely used charging method. However, the increasing of charging current alone cannot significantly reduce the charging time because of extended duration of the CV charging mode. In addition, the increased charging current accelerates the degradation of the secondary battery. Thus, before proposing a new charging method, effects of CC/CV charging on the charging time and degradation, specifically side reactions, are firstly analyzed.

Figure 8A:
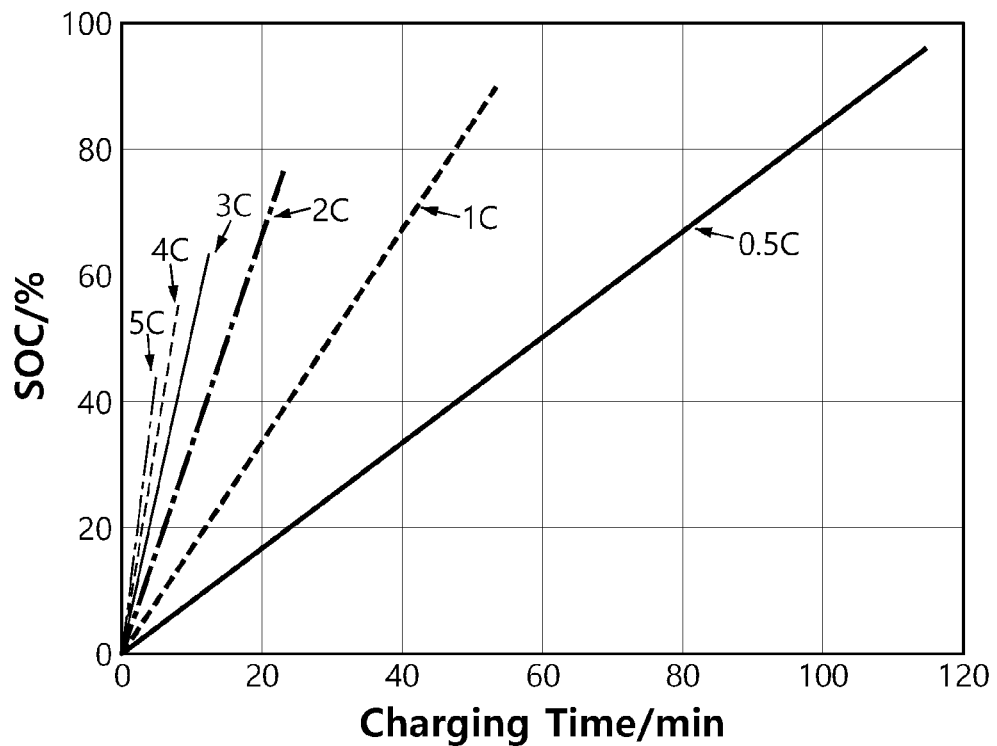
FIG. 8a is a graph showing a time taken until a terminal voltage reaches a cutoff voltage, at different charging currents (C-rates), when a pouch-type lithium secondary battery is charged in a CC charging mode.
Figure 8B:
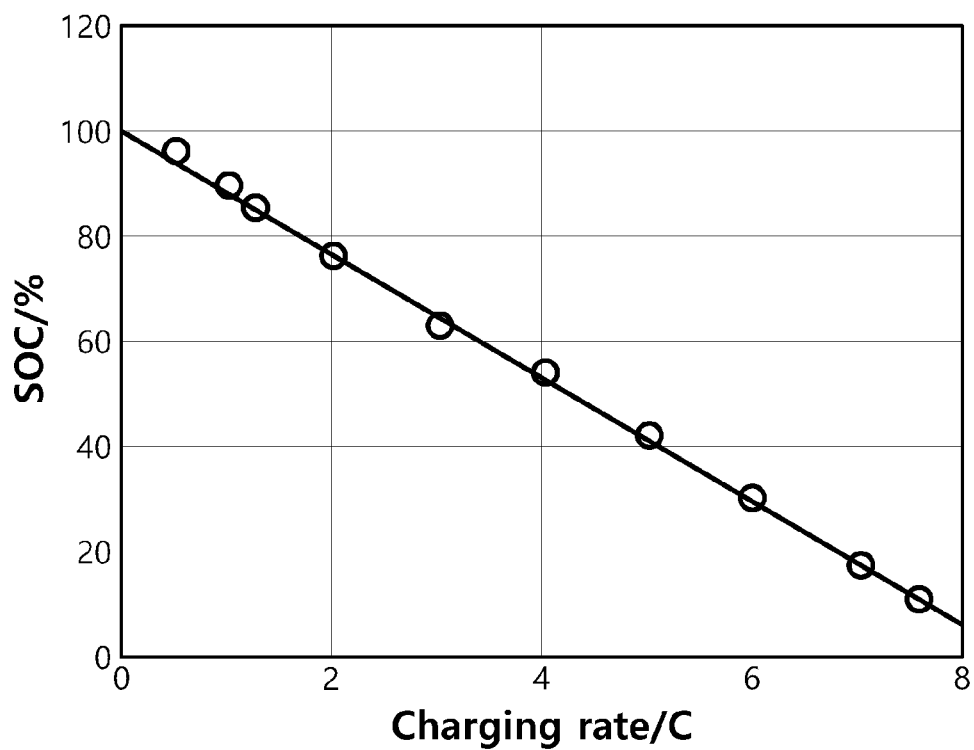
FIG. 8b is a graph showing a SOC when the terminal voltage reaches a cutoff voltage, at different charging currents.

The charging time up to 100% SOC is determined by two factors. One factor is the magnitude of current applied during the constant current charging mode, and the other factor is the cutoff voltage in the constant voltage charging mode. Effects of the magnitude of the charging current on the SOC and the charging time in CC mode were studied experimentally using a pouch-type battery. The results are shown in FIGS. 8a and 8b, where the cutoff voltage was set to be 4.15 V. As shown in FIG. 8a, a high charging current reduces the charging time, but the terminal voltage reaches the cutoff voltage of 4.15V even at a lower SOC. Thus, the maximum SOC to be charged at a given charging current during the CC mode is limited. Also, as shown in FIG. 8b, the relationship between the charging current and the maximum chargeable SOC is inversely proportional to the charging current. That is, the higher the charging current, the lower the maximum chargeable SOC.

Figure 9A:
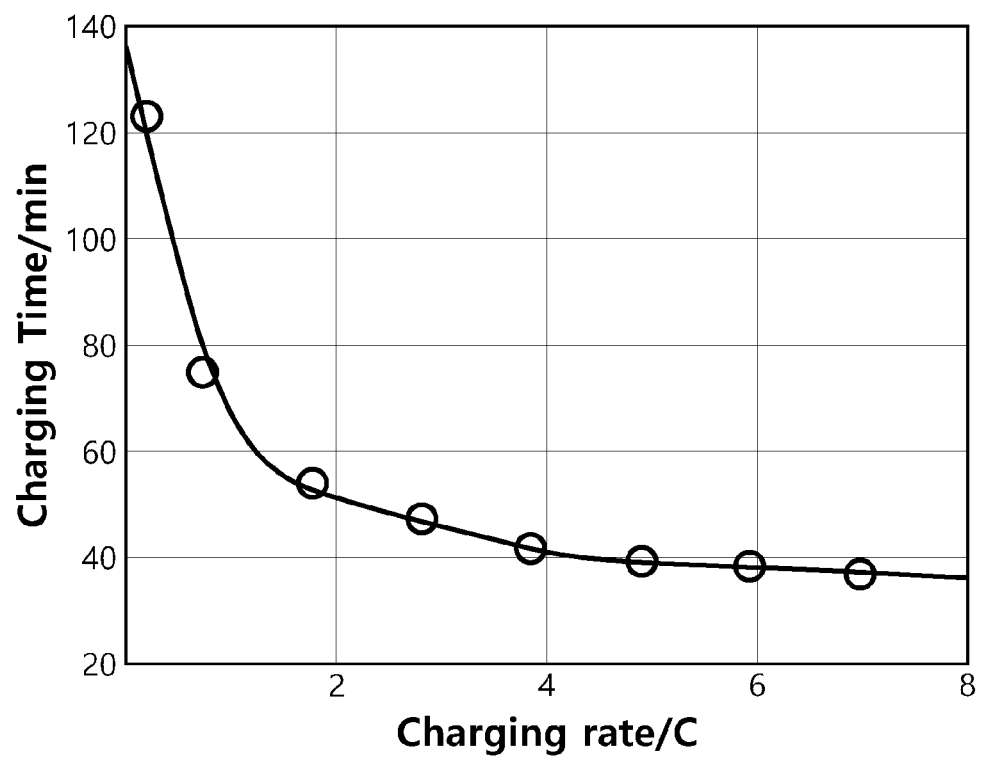
FIG. 9a is a graph showing a charging time as a function of charging current.
Figure 9B:
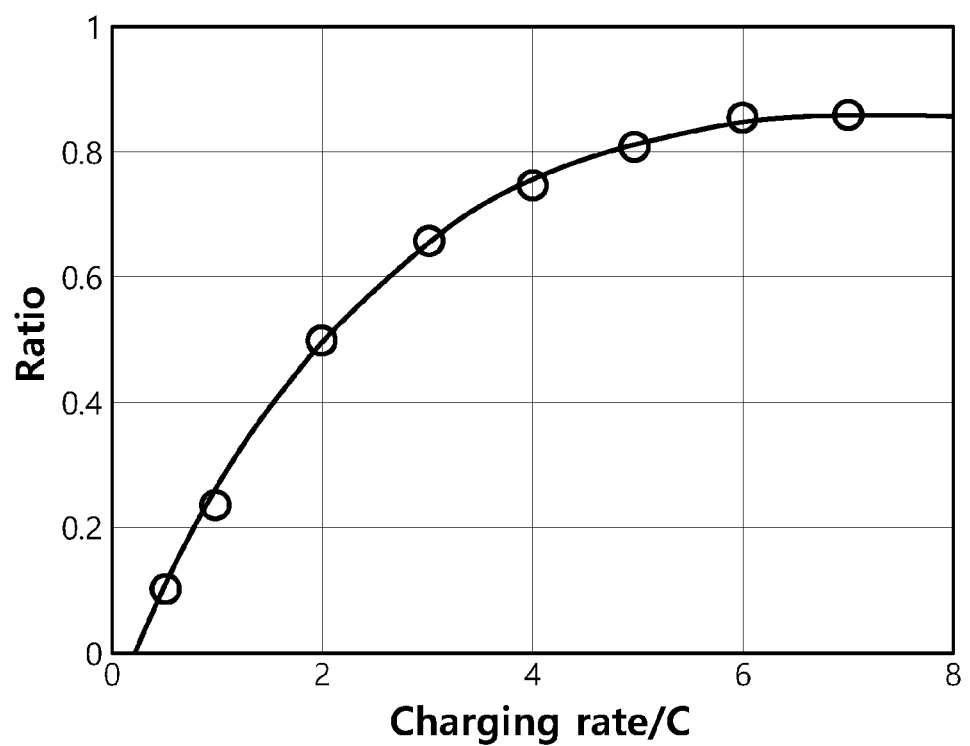
FIG. 9b is a graph showing a ratio between a charging time by CV charging and a charging time by CC/CV charging.

Likewise, effects of the CC charging combined with the CV mode on the charging time were also studied in another aspect. Here, a pouch-type battery is charged from 0% to 100% SOC. The charging current was varied from 0.5 C to 7 C and the cutoff voltage was set to be 4.15V. The charging time as a function of charging current is shown in FIG. 9a, and the ratio between the charging time by CV charging and the charging time by CC/CV charging is depicted in FIG. 9b. Referring to FIGS. 9a and 9b, if the charging current is less than 1.5C, the charging time is significantly reduced even with a slight increase of charging current. Also, the charging time is still reduced meaningfully even when the charging current is between 1.5C and 4.5 C. However, if the charging current rises over 4.5C, the charging time is not reduced meaningfully even though the charging current increases. In addition, as shown in FIG. 9b, the ratio of charging time between the CV charging method and the CC/CV charging method increases with increasing of the charging current. This is because the higher the charging current is, the shorter does it take to reach the cutoff voltage even at a low SOC. Consequently, the charging time in the CV mode takes longer, which leads to a long overall charging time.

[Effects of CC/CV Charging on Side Reactions]

Figure 10A:
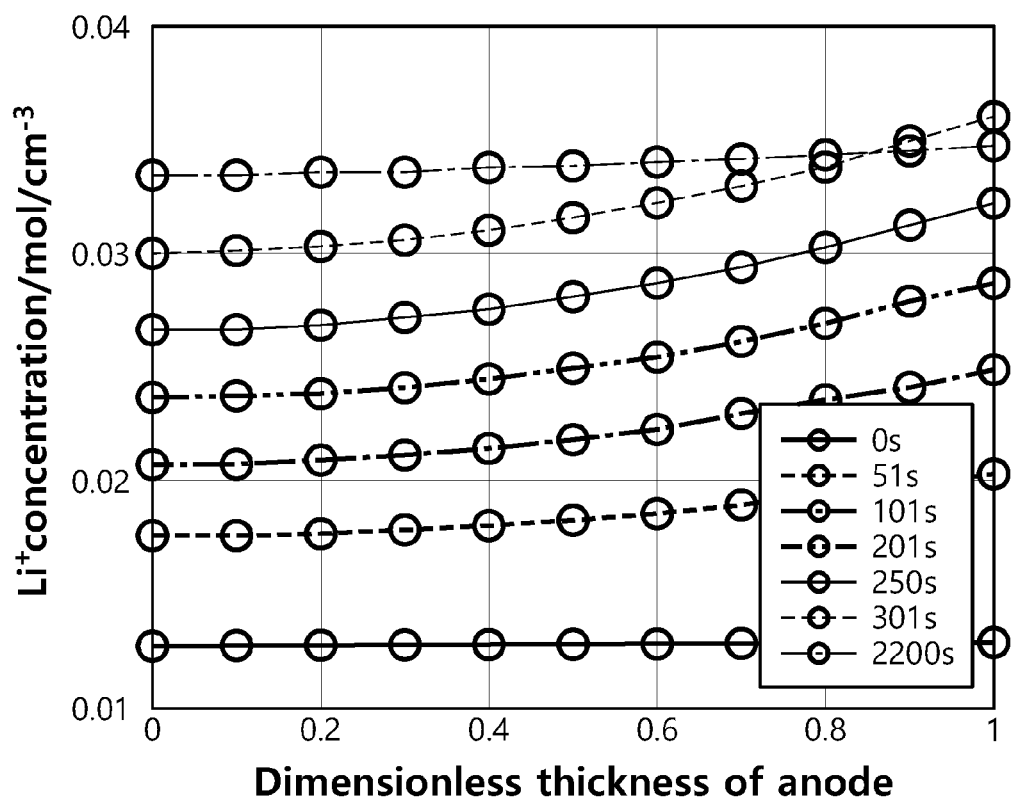
FIG. 10a is a graph showing a surface ion concentration of active material particles, extamated by ROM-EKF.

Effects of CC/CV charging on side reactions are investigated, where the SOC range and the charging current are varied. As discussed above, ion concentration heavily affects side reactions. The surface ion concentration of active material particles is estimated using the ROM-EKF, and its results are shown in FIG. 10a. In FIG. 10a, the x axis represents the coordinate in the direction of a through-plane of the anode. Each curve represents the surface ion concentration of different anode particles at a specific time. At the beginning of charging, the concentrations are uniformly distributed in the electrode ('0s' curve). As more ions are transported from the cathode, the ion concentration forms a high gradient gradually, reaches the maximum value after several minutes and then becomes less and finally zero after around 2200s. The ion concentration at the interface between the active material layer of the anode and the separator at 301s (at the end of CC charging) becomes higher than that at 2200s (at the end of CV charging). In addition, the value of surface ion concentration of a particle is dependent upon the location of the particle due to the limitation of diffusion rate and the ion concentration gradient in the electrolyte of the anode. The closer the particle to the separator is, the higher the surface ion concentration is.

Figure 10B:
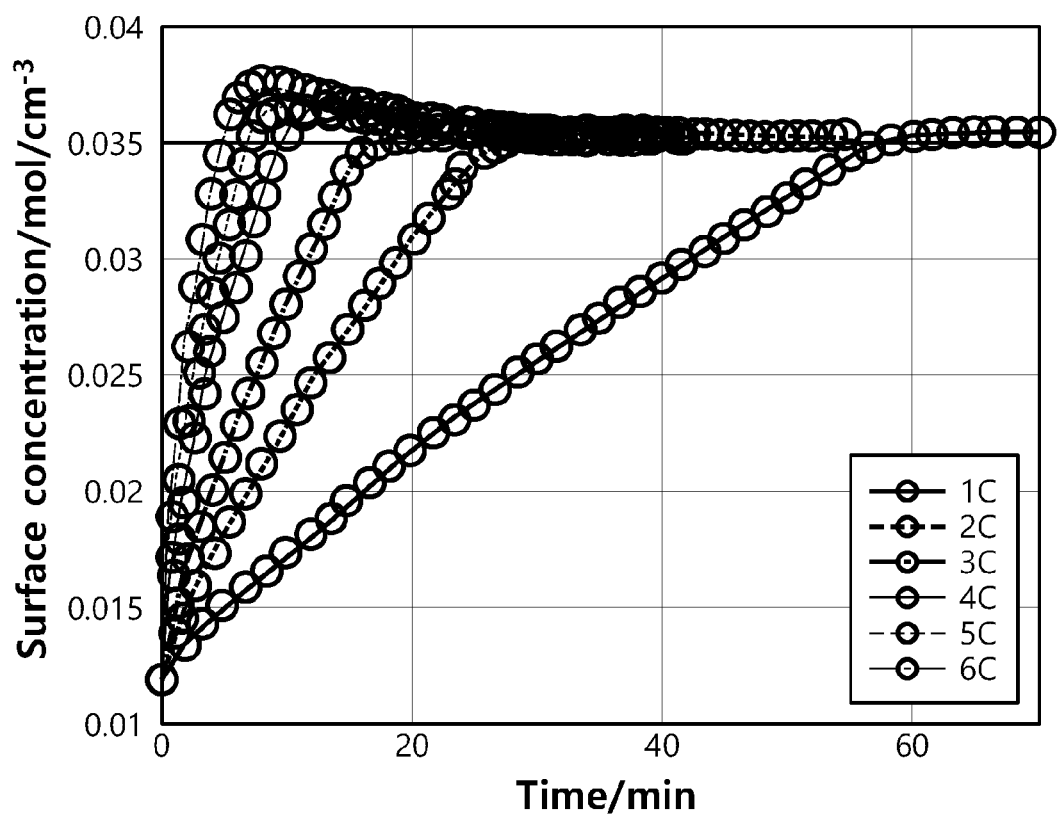
FIG. 10b is a graph showing a surface ion concentration of particles just next to a separator in time domain.

The surface ion concentration of the particle just next to the separator in time domain is depicted in FIG. 10b. An overshoot of the ion concentration is observed while the charging mode is changed until an equilibrium is reached, when the charging current is larger than 4 C. The overshoot is decreased in CV mode simply because of the decreased charging current. At the steady state when SOC reaches 100%, the ion concentration converges to a vicinity of a value. This implies that the anode particles cannot accept more lithium ions and the lithium ion concentration reaches saturation. The ion concentration value is 0.035 mol/cm$^3$ at SOC=100%, and thus the value is chosen as the saturated concentration, $c^*_s$, corresponding to an upper limit of the surface ion concentration of the anode particle in the charging method according to the present disclosure.

The high ion concentration caused by the overshoot leads to a low equilibrium potential that increases the magnitude of activation overpotential for side reactions and consequently promotes the side reactions. In addition, the excessive ions also increase the exchange current density of side reactions, $i_{0,side}$.

Actually, the side reaction rate may be calculated using the B-V equation, as in Equation (3). The amount of ion loss, $C_{ionloss}$, that represents the consumed ions by the side reactions is the same as the integration of side reaction rate, $j_{side}^{Li}$, over the volume of the anode active material and the time as in Equation (8).

$$C_{ionloss}(\tau) = \int_{x=0}^{\delta_n} \left( \int_{t=0}^{\tau} |j_{side}^{Li}(l, t)| dt \right) A dl \tag{8}$$

Here, $C_{ionloss}$ has a unit of Ah, $\delta_n$ is the thickness of the anode active material, $\tau$ is the total operating time, and A is the cross-section area of the lithium-ion battery.

Figure 11A:
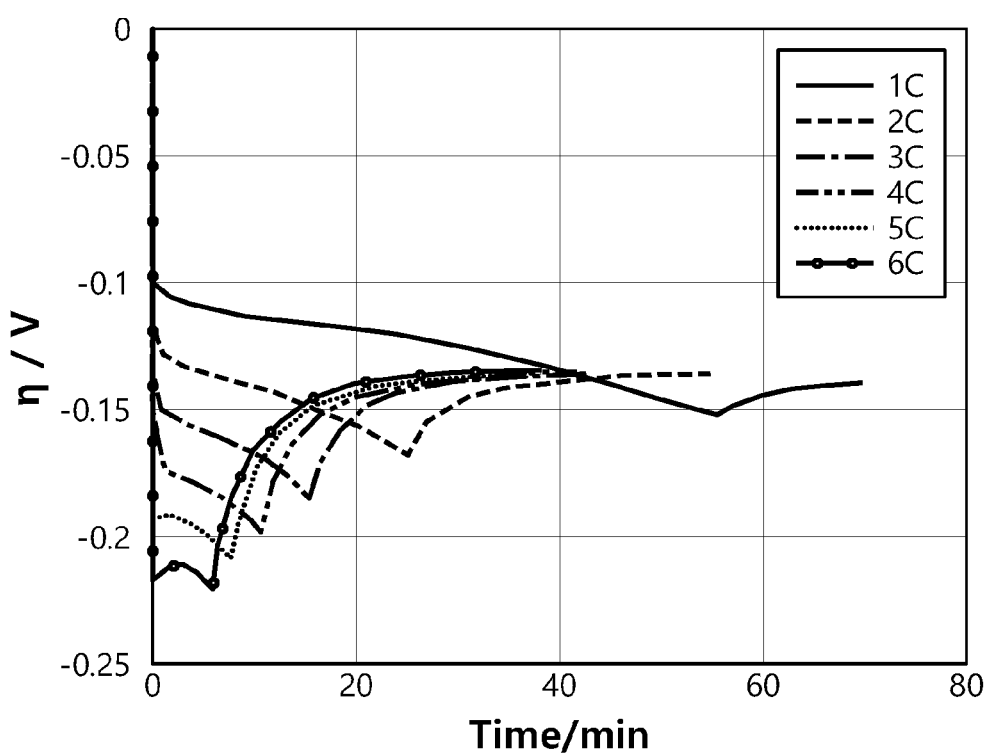
FIG. 11a is a graph showing the variation of overpotential according to magnitude of the charging current and time.
Figure 11B:
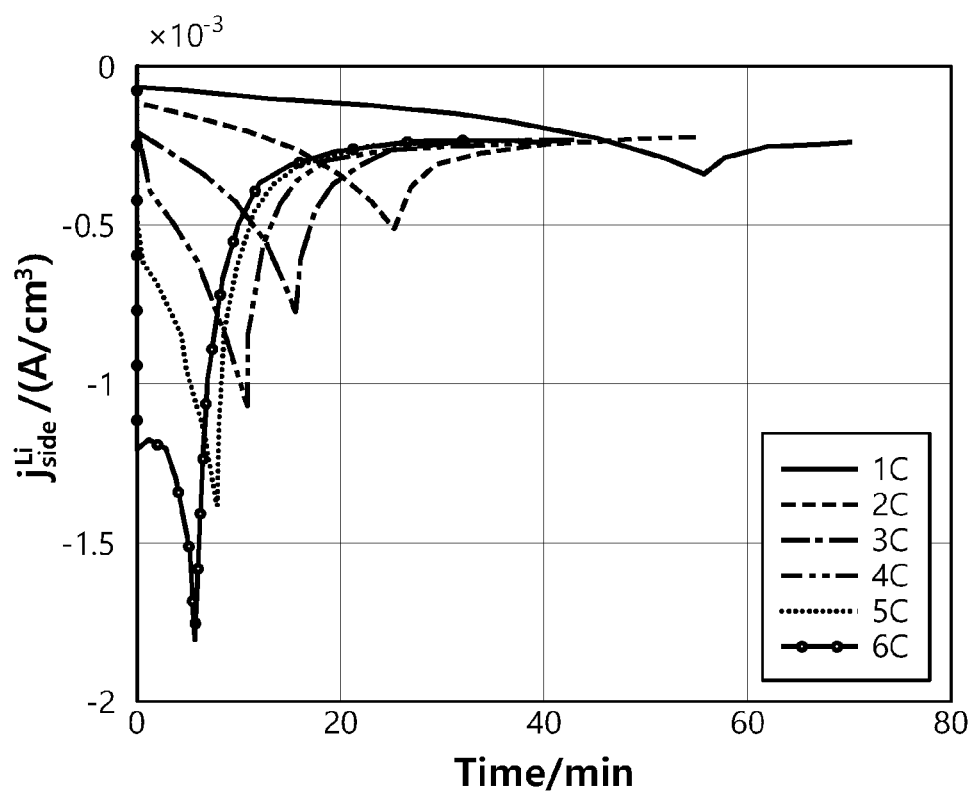
FIG. 11b is a graph showing the variation of side reaction rate according to magnitude of the charging current and time.
Figure 11C:
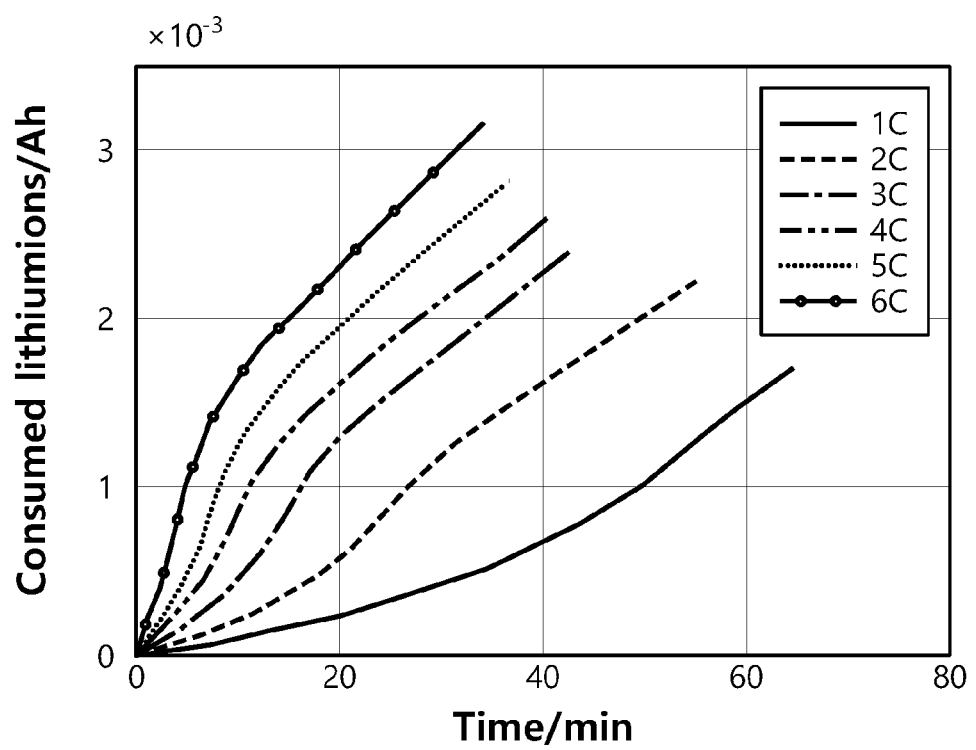
FIG. 11c is a graph showing the amount of loss of lithium ions according to magnitude of the charging current and time.
Figure 11D:
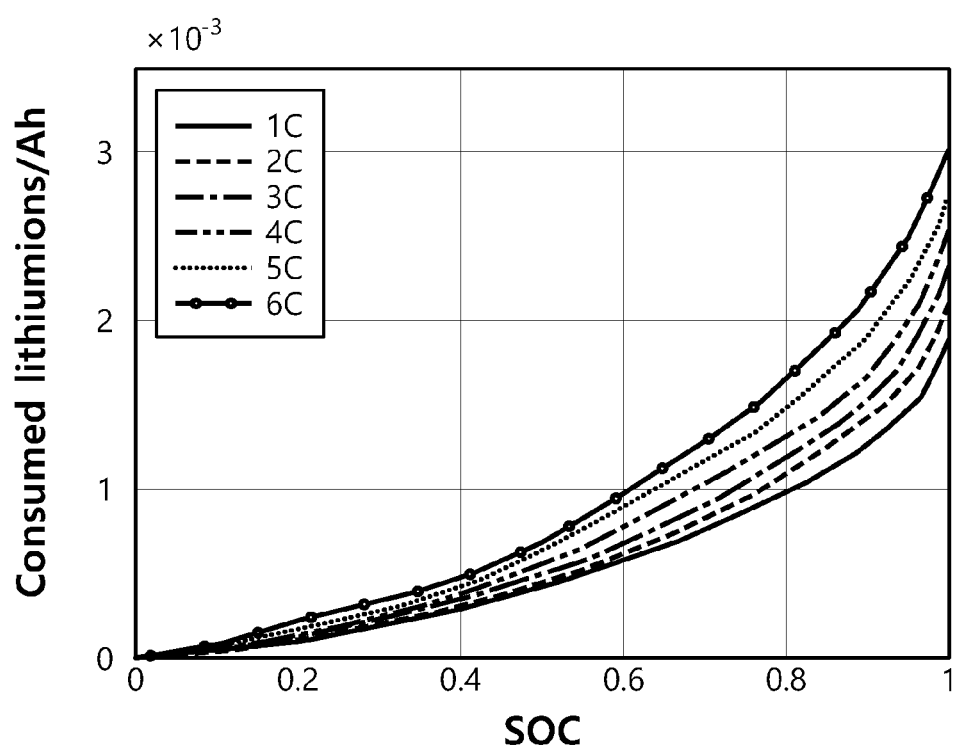
FIG. 11d is a graph showing the amount of loss of lithium ions according to magnitude of the charging current and SOC (0% to 100%)

In fact, it is obvious that the side reaction rate is dominantly affected by the overpotential in the B-V equation. The overpotential is the function of the charging current and the range of SOC, which is calculated at a cutoff voltage of 4.15V as shown in FIG. 11a. In addition, the side reaction rate over time and the amount of ion loss versus SOC are shown in FIGS. 11b, 11c and 11d. The magnitude of the overpotential increases with the increasing charging current until the terminal voltage reaches the cutoff voltage and then decreases in the CV mode. Accordingly, the side reaction rate tends to follow the shape of the overpotential, and the amount of consumed ions calculated by Equation (8) increases at high current. According to the calculation of the ion loss as a function of SOC, the amount of ion loss is relatively negligible in a low SOC range, but increases as the SOC increases.

When the SOC is less than 40%, a high charging current increases the side reactions but reduces the charging time. In addition, the relationship between the charging time and the side reaction rate is almost linear. Therefore, the contribution of the high charging current on degradation is not significant based on Equation (8) and FIG. 11d. In fact, the increased charging current at the low SOC range does not significantly cause more ion losses in comparison to other ranges, but may contribute to reduce the charging time. This is valid only at a constant cell temperature. The side reaction rate becomes higher at elevated temperature.

Figure 11E:
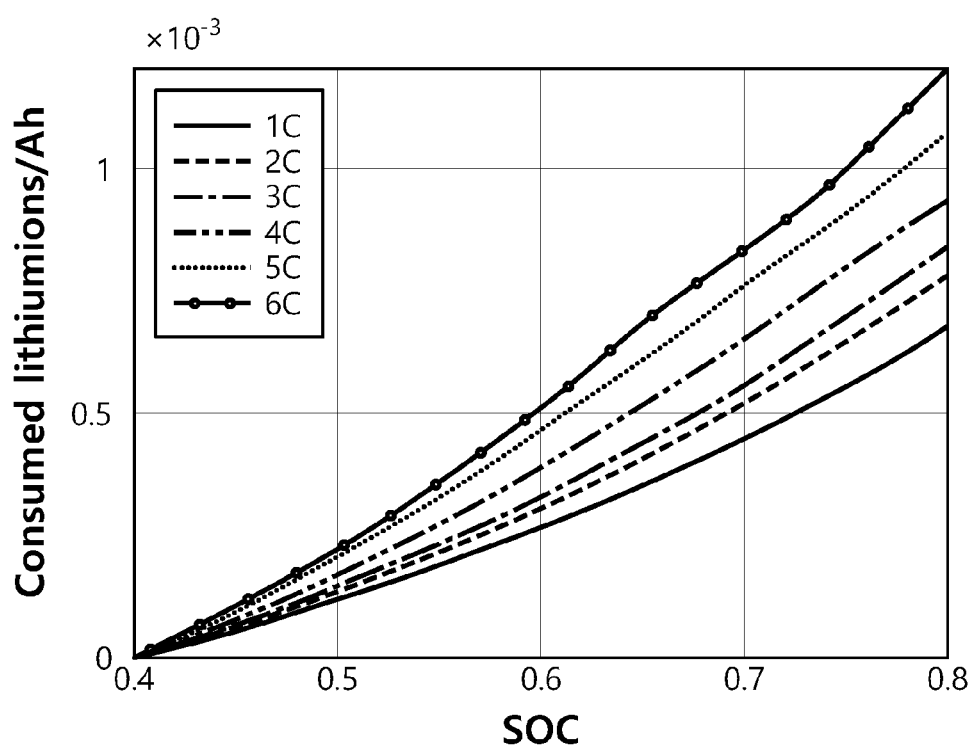
FIG. 11e is a graph showing the amount of loss of lithium ions according to magnitude of the charging current and SOC (40% to 80%)

In the middle SOC range, the relationship between the charging time and the magnitude of overpotential of side reaction becomes nonlinear, and the concentration overshoot appears in this SOC range, both of which accelerate the side reactions. Therefore, as the SOC increases, the relationship between the charging time and the side reaction rate becomes nonlinear, and the magnitude of the slope increases with the increase of charging current. As a result, a high charging current largely accelerates the battery degradation, as shown in FIG. 11e.

Figure 11F:
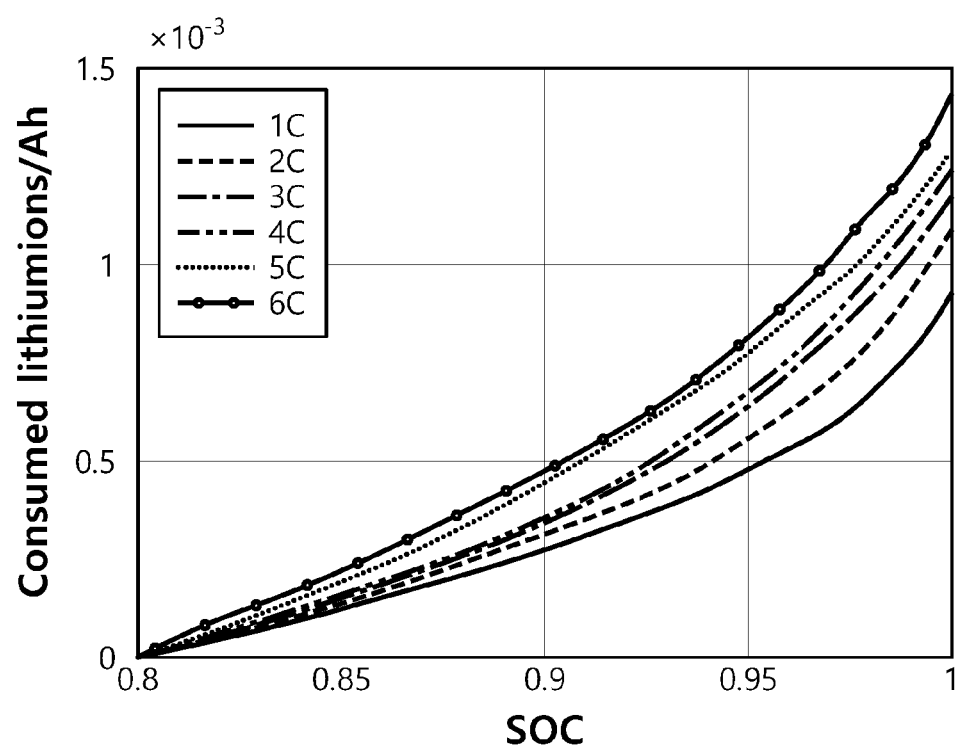
FIG. 11f is a graph showing the amount of loss of lithium ions according to magnitude of the charging current and SOC (80% to 100%).

In a high SOC range, the side reaction rate is very lower than that of the middle SOC range because of the continuously reduced charging current in the CV mode. However, the charging time takes longer than those in other SOC ranges. In addition, the equilibrium potential becomes lower because of the high ion concentration, and the overpotential gets higher, which causes more loss of ions. In this SOC range, the charging current still has a significant effect on lithium ion loss because of a longer charging time in the high SOC range and a higher side reaction rate caused by the higher ion concentration, as shown in FIG. 11f.

[Design of the New Fast Charging Method]

Figure 12:
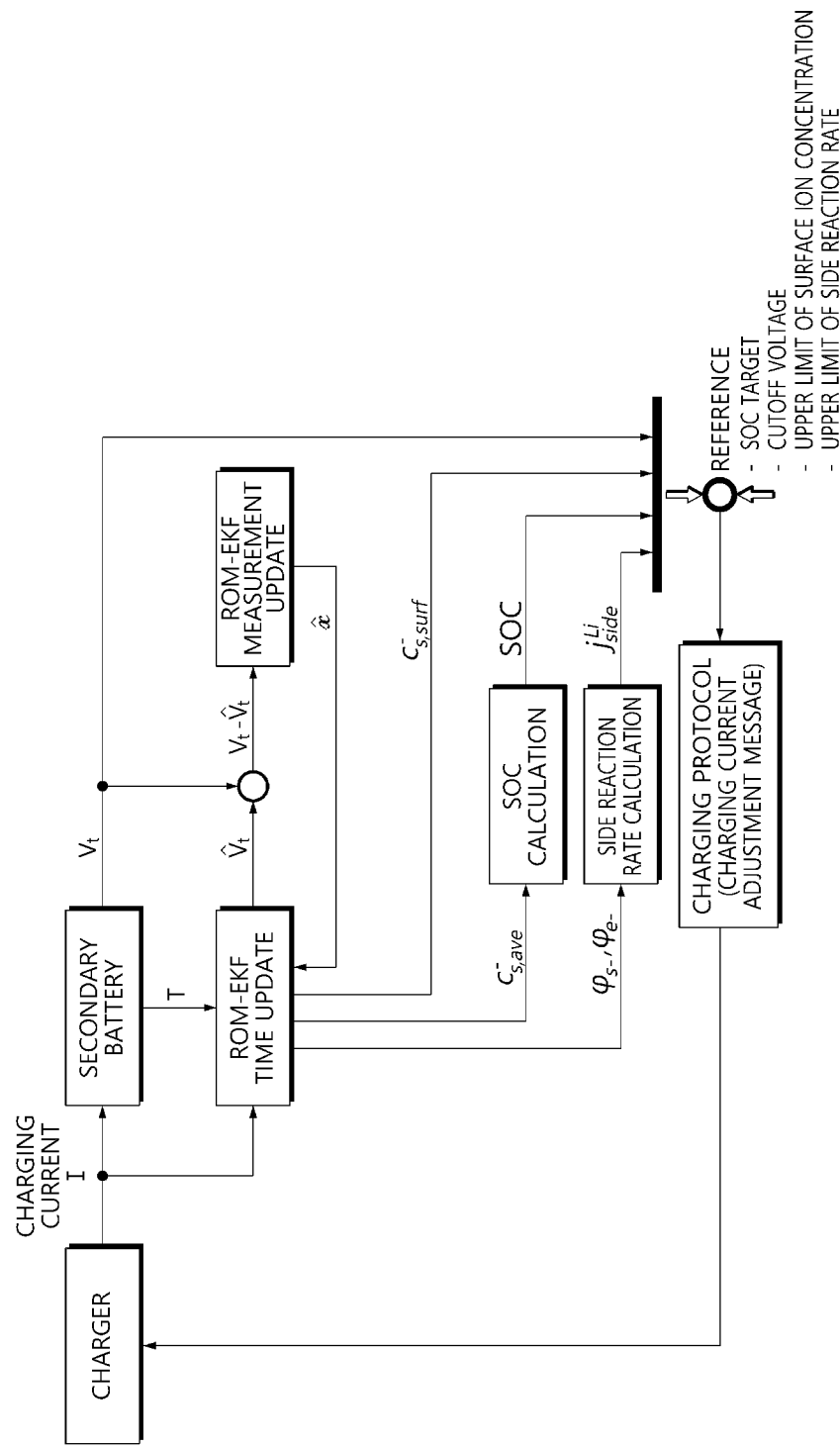
FIG. 12 is a diagram showing a fast charging method proposed according to an embodiment of the present disclosure.

The new charging method is designed based on the ROM-EKF that provides variables like a surface ion concentration of the anode particles and an anode potential. The variables are used to estimate the SOC and the side reaction rate. In order to activate the cutoff voltage, the terminal voltage is measured. A block diagram of the proposed fast charging method is depicted in FIG. 12. The inputs for the ROM-EKF are the charging current, the terminal voltage and the temperature of the secondary battery. Once reference values for a requested SOC, cutoff voltage, an upper limit of the surface ion concentration in the anode and an upper limit of the side reaction rate in the anode are given, a charging protocol is generated by comparing the values with those of the estimated and measured. The charging protocol is used to control the charger to generate charging currents. The charging protocol includes a reduction schedule for the magnitude of the charging current. According to the charging protocol, a current reduction request is transmitted to the charger, and the charger reduces the magnitude of the charging current accordingly.

When a battery is being charged, the requested SOC (a target SOC) is one of conditions that stop charging. Meanwhile, other reference values are used to set the upper limitations that adjust the charging current to prevent from inducing degradation. A flowchart for the charging protocol according to the present disclosure is shown in FIG. 5.

At the beginning, a maximum charging current is applied until one of the three reference variables reaches its upper limitation. Upon reaching the limitation, the charging current is reduced and kept as constant until the SOC is changed according to a predefined amount $\Delta SOC$. This charging protocol is repeated until the conditions of stop charging are fulfilled.

As an example, experimental data obtained by measuring the change of the charging current according to the SOC in a state where the cutoff voltage of 4.15V is set is shown in FIG. 13. In FIG. 13, the circles present the experimental data. Firstly, the requested SOC is determined as one of conditions that stop charging. At the beginning of charging, the battery is charged with a maximum current of 7.6 C. The maximum current is the magnitude of a maximum charging current provided by the manufacturer. Once the terminal voltage reaches the cutoff voltage, the charging current is reduced to a lower level according to the given $\Delta SOC$ as shown in FIG. 13.

Figure 14:
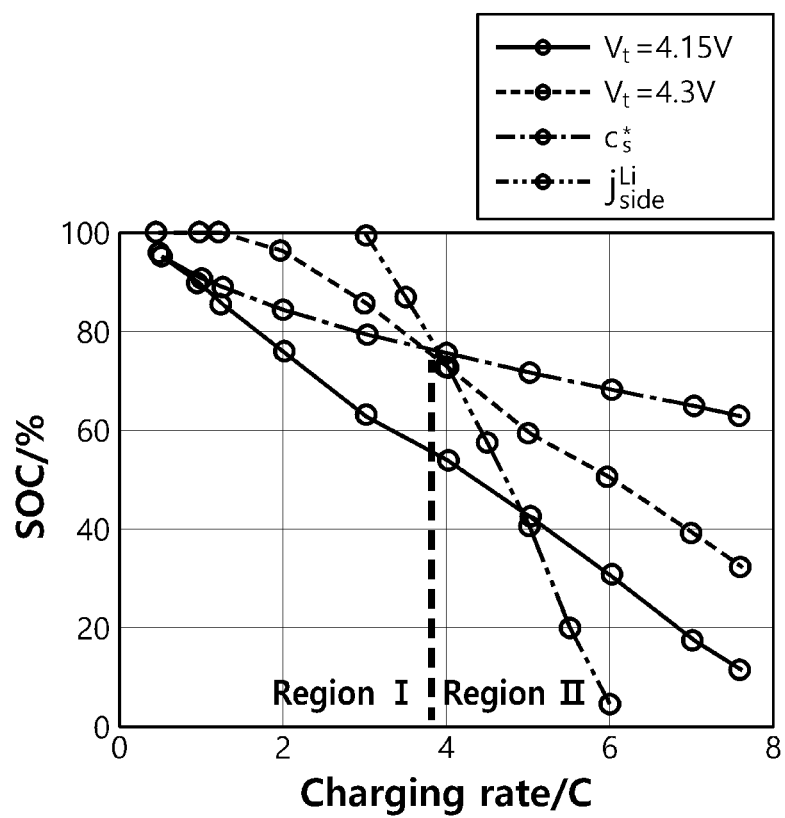
FIG. 14 is a graph showing simulation results of SOC and side reaction rate as a function of charging current using ROM-EKF according to the present disclosure, under four limitations.

The charging protocol may be optimized by considering other limitations that prevent degradation. The first limitation is the cutoff voltage. The manufacturer of the battery recommends 4.3V at the maximum charging current instead of 4.15V as the cutoff voltage, and the increasing effect of the cutoff voltage will be explained later. The second limitation is the calculated maximum surface ion concentration of the anode particle as explained above. The final limitation is the maximum side reaction rate selected at 40% SOC based on the result of analysis as shown in FIG. 11d. The lithium ion loss does not significantly increase at 40% SOC. Under consideration of the four limitations, the SOC as a function of the charging current using the ROM-EKF with a side reaction rate according to the present disclosure is simulated and depicted in FIG. 14. The results shown in FIG. 14 provide an important guideline how the charging current at different SOC should be determined for an optimal charging protocol that reduces the charging time and at the same time alleviates degradation.

Under the consideration of the limitations, several possible protocols are designed by combining the different limitations listed in Table 3, and each protocol is simulated using the ROM-EKF. As shown in the simulation results of FIG. 14, the charging current is limited as the SOC increases. At a low SOC range, an upper limit of the side reaction rate primarily limits the charging current at the first, and then the cutoff voltage of 4.15V is applied up to a middle range of SOC and continuously up to 100% SOC. In the CV mode with the cutoff voltage of 4.15V in a high SOC range, the surface ion concentration exceeds the upper limit and an overshoot occurs. Thus, the limitations are divided into two regions. In the region I, an upper limit of the surface ion concentration, $c^*_s$, is the first limitation that should prevent the overshoot of the surface ion concentration. In the region II, other three limitations are used to limit the charging current. Since the overshoot of the surface ion concentration of particles is caused by the mismatch of ions between transported and diffused, adding extra resting periods helps reduce the numbers of ions transported and give the ions in particles extra time to diffuse and to be intercalated into the lattice structure. Therefore, the duration of the resting is determined by considering the gradient of ion concentration in the anode active material. On the other hand, high charging currents larger than 5C may make the anode potential negative even at low SOC, which creates favorite conditions for lithium plating. Thus, 5C is preferably selected as the highest charging current even though the manufacturer recommends 7.6 C.

Figure 15A:
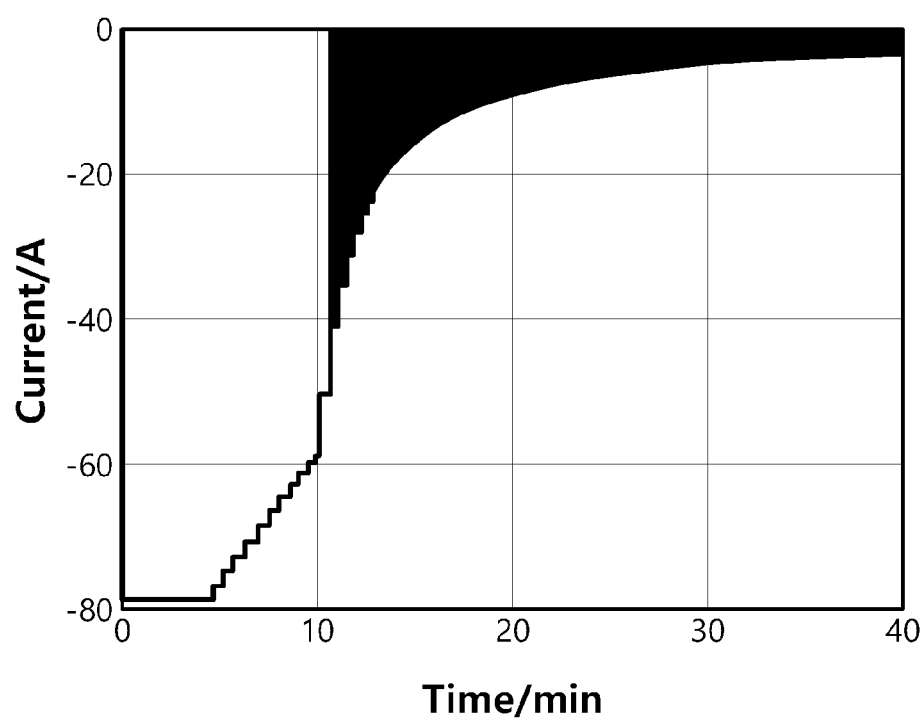
FIGS. 15a to 15d are graphs showing simulation results of a charging protocol considering an upper limit of side reaction rate ($j_{side,max}^{Li}$) and an upper limit of surface ion concentration ($c^*_s$), which respectively illustrate simulation results of current, terminal voltage, surface ion concentration and side reaction rate.
Figure 15B:
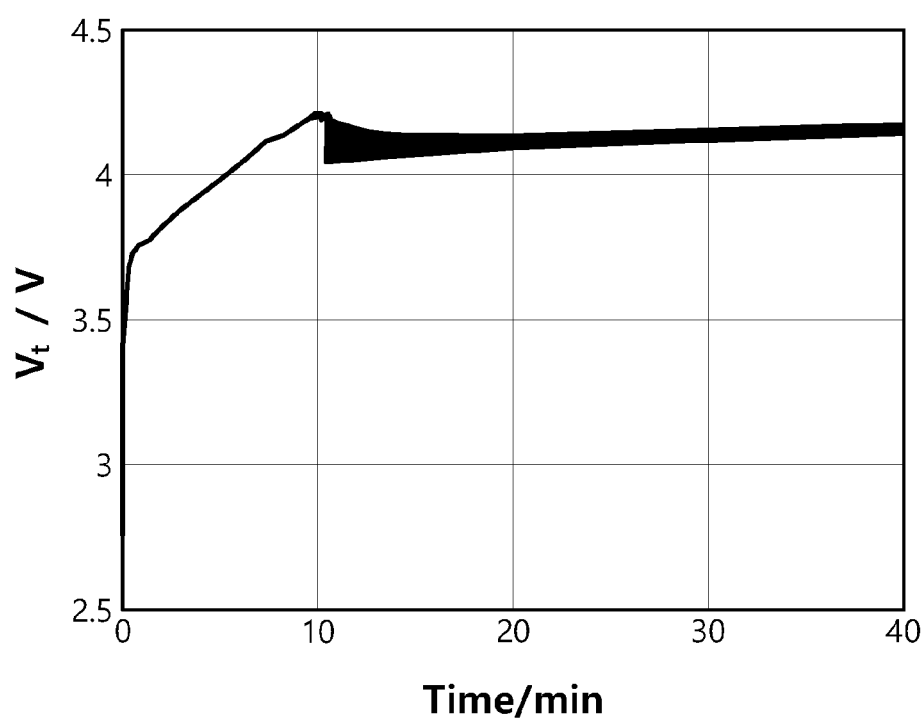
Figure 15C:
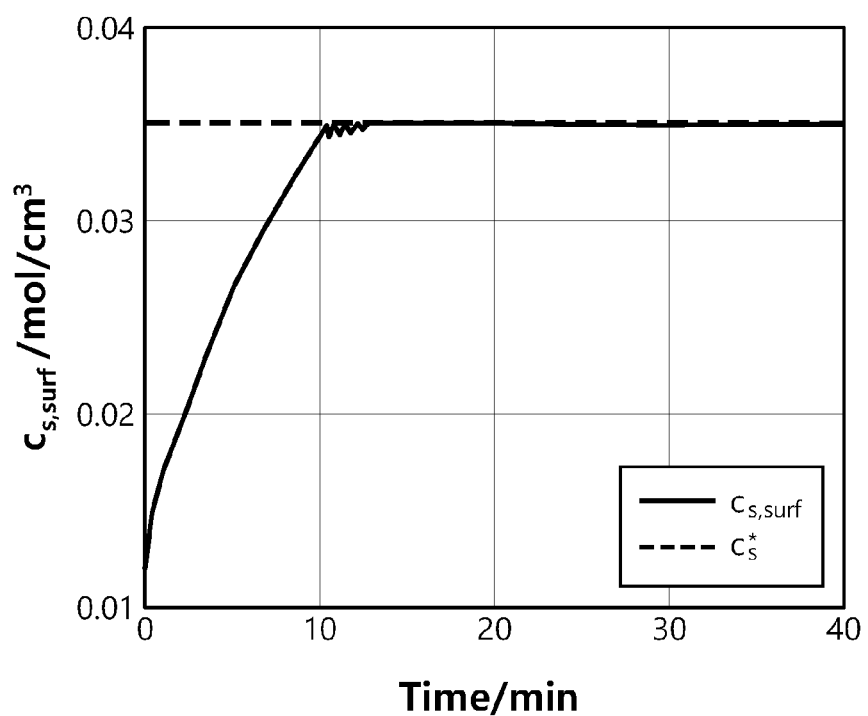
Figure 15D:
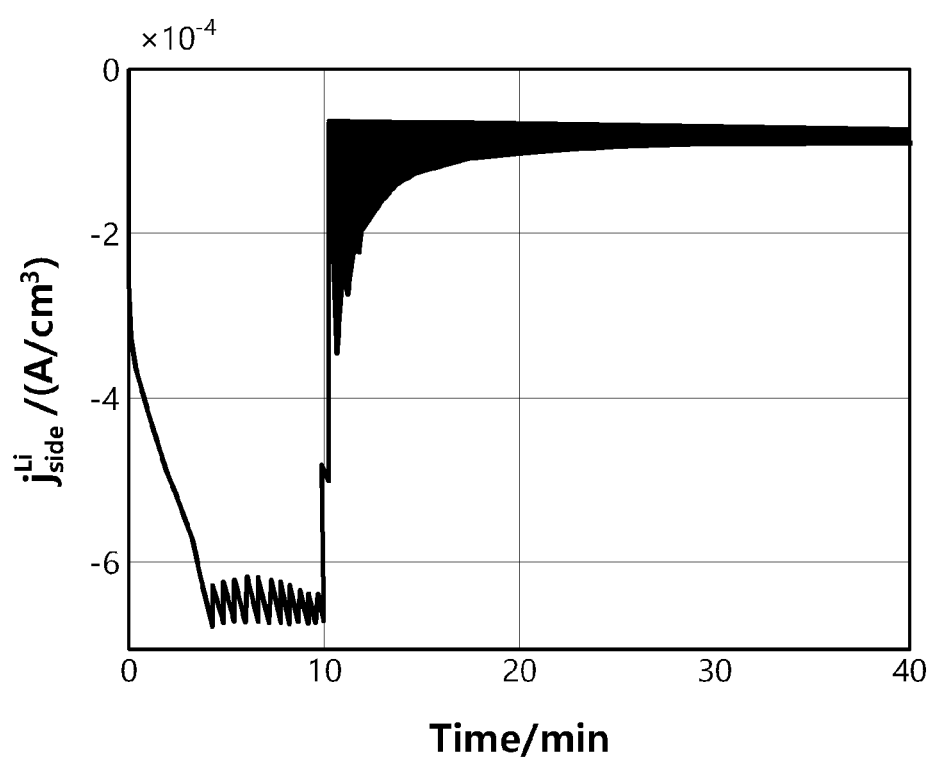

As an example, the simulated results of the charging protocol considering the upper limits of the side reaction rate, $j_{side,max}^{Li}$, and the surface ion concentration, $c^*_s$, are shown in FIGS. 15a and 15d. FIGS. 15a and 15d include the simulation results of the current, terminal voltage, surface ion concentration and the side reaction rate, respectively. The surface ion concentration is not larger than the maximum allowed saturation concentration. Also, the side reaction rate is also limited up to a middle SOC range until the CV mode becomes active.

Five charging protocols are simulated and the resulting charging times are summarized in Table 3. Here, the two classical charging protocols, namely a charging protocol where CV charging is performed by the cutoff voltage of 4.15V after 1 C-CC charging and a charging protocol where CV charging is performed by the cutoff voltage of 4.15V after 5 C-CC charging, are compared. The charging time of the 1 C-CC/CV protocol takes about 71 min to fully charge the battery from 0% to 100% SOC. The FC-4.3V charging protocol and the FC-4.15V charging protocol using the upper limit of the surface ion concentration in the anode as the limitation and considering a cutoff voltage of 4.3V and 4.15V reduce the charging time to 44% and 52% of that by 1 C-CC/CV charging protocol, respectively. Here, the increased cutoff voltage has contributed to reduce the charging time.

TABLE 3

| Charging protocol | CC/CV (1 C) | CC/CV (5 C) | FC-4.3 V | FC-4.15 V | FC-SR |
|---|---|---|---|---|---|
| Limitation | 4.15 V | 4.15 V | 4.3 V, $c^*_s$ | 4.15 V, $c^*_s$ | Side reactions, $c^*_s$ |
| Charging time | 71 min | 38 min | 31.5 min | 37.5 min | 40 min |

The charging time by the FC-4.15V charging protocol is comparable to that of the 5 C-CC/CV charging protocol. The FC-4.15V charging protocol considers the cutoff voltage and the surface ion concentration as the limitations, and the charging time takes longer than that of the FC-4.3V charging protocol. This is because the FC-4.3V charging protocol reduces the time during the CC mode.

Figure 16A:
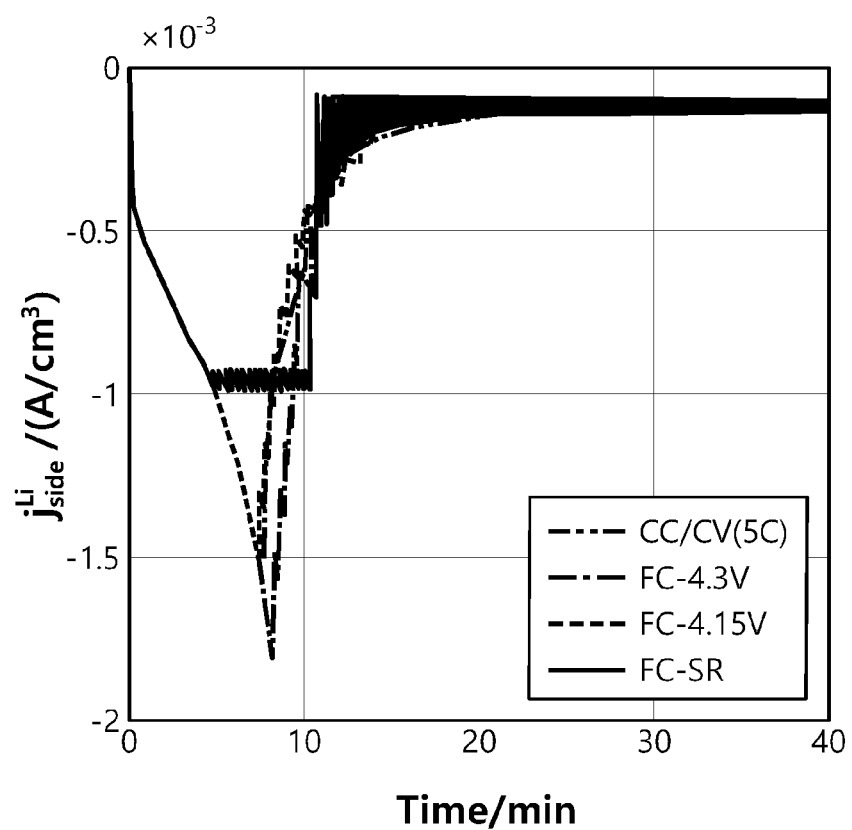
FIGS. 16a and 16b are graphs showing simulation results of side reaction rates and consumed lithium ions with respect to four charging protocols.
Figure 16B:
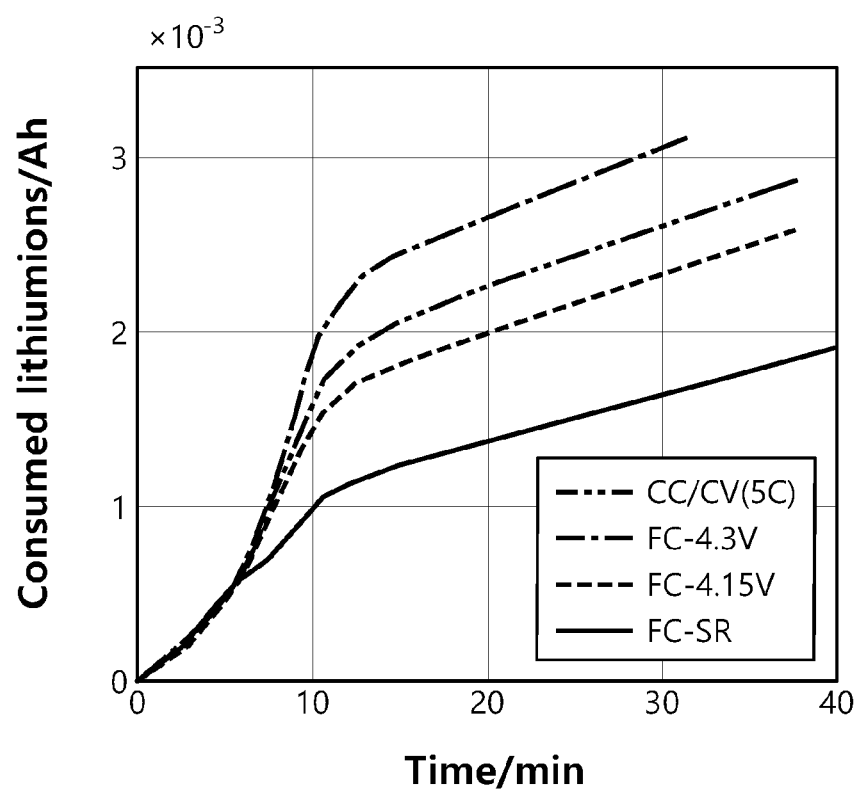

In addition, the simulation results of side reaction rate and consumed lithium ions of four charging protocols are shown in FIGS. 16a and 16b. In FIG. 16a, the area enclosed by the side reaction rate represents the total consumed lithium ions. As shown in FIGS. 16a and 16b, when the cutoff voltage increases, the CC charging periods become extended, but the magnitude of side reaction rate becomes higher and the duration of the CC charging period takes longer. Consequently, the consumed lithium ion loss become increased. If the side reaction rate is further limited, the area becomes smaller and the ion loss becomes significantly reduced. However, the charging time takes longer.

Figure 17:
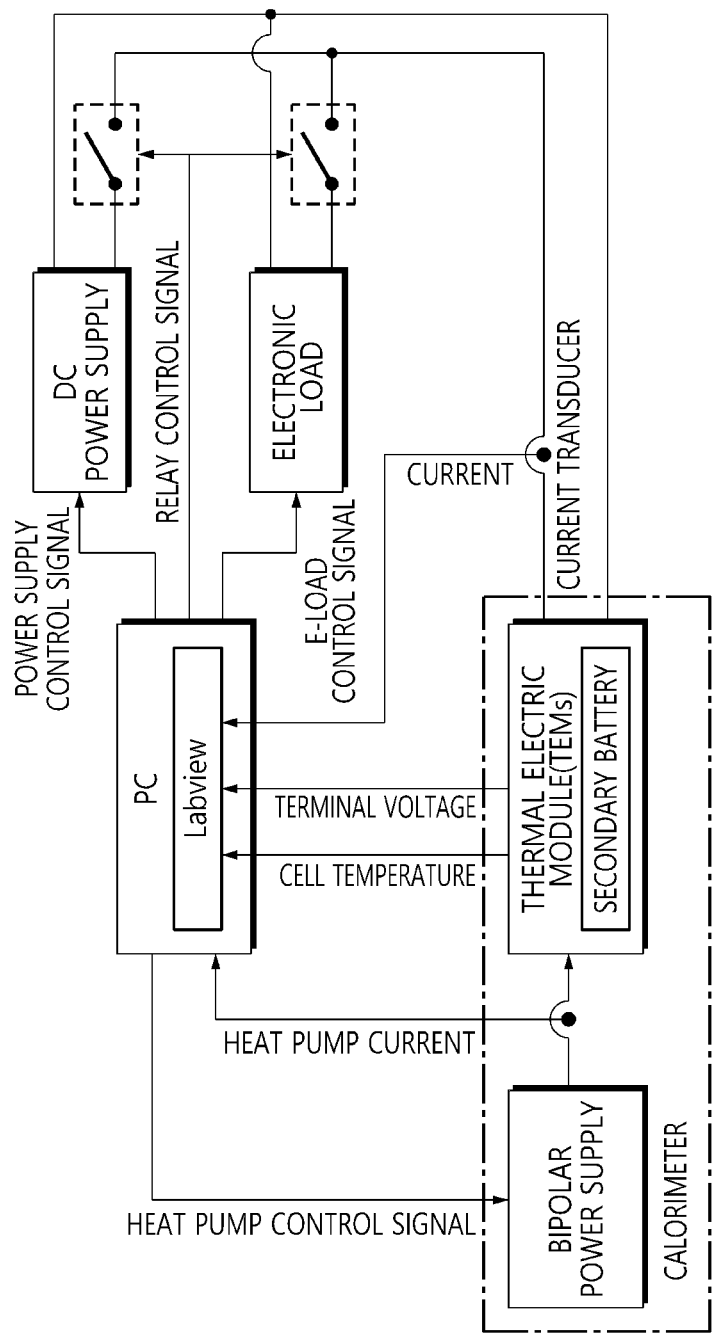
FIG. 17 is a block diagram showing BIL (Battery-In-the-Loop) used in testing different charging protocols.

In the present disclosure, the different charging protocols are implemented and experimentally evaluated using BIL (Battery-In-the-Loop) that facilitates to operate a test station with the designed controls in real time. The block diagram for the BIL is shown in FIG. 17. The test station is designed to charge and discharge the secondary battery using a DC power supply and an electronic load that are connected in parallel to the secondary battery. The DC power supply and the electronic load are controlled by LabVIEW embedded in a PC. In addition, the secondary battery is placed in a designed calorimeter that dynamically rejects the heat generated by the battery. The calorimeter includes two thermal electric modules (TEMs), a bipolar power supply and a control algorithm. The control algorithm determines magnitude and direction of the current flowing into the TEMs. The TEMs have both cooling and heating functions and regulate the surface temperature of battery at set values. The maximum temperature variation becomes less than 1° C. even at a large charging current of 120 A. Thus, the calorimeter allows for minimization of the effects of the temperature on degradation of the battery.

The proposed charging method is implemented in the test station by integrating the ROM-EKF into the LabVIEW using a MATLAB script. The ROM-EKF facilitates estimation of the internal variables like SOC, surface ion concentrations and side reaction rate based on the current and the terminal voltage of the battery. The estimated internal variables are used to constrain the charging current and generate the charging protocol upon the requested SOC.

The secondary battery used for the experiments is a pouch-type large format lithium-ion battery, whose dimension is about 200 mm×150 mm×5 mm The capacity of the secondary battery is 15.7 Ah and the operating voltage is in the range of 2.5V to 4.15V.

Figure 18A:
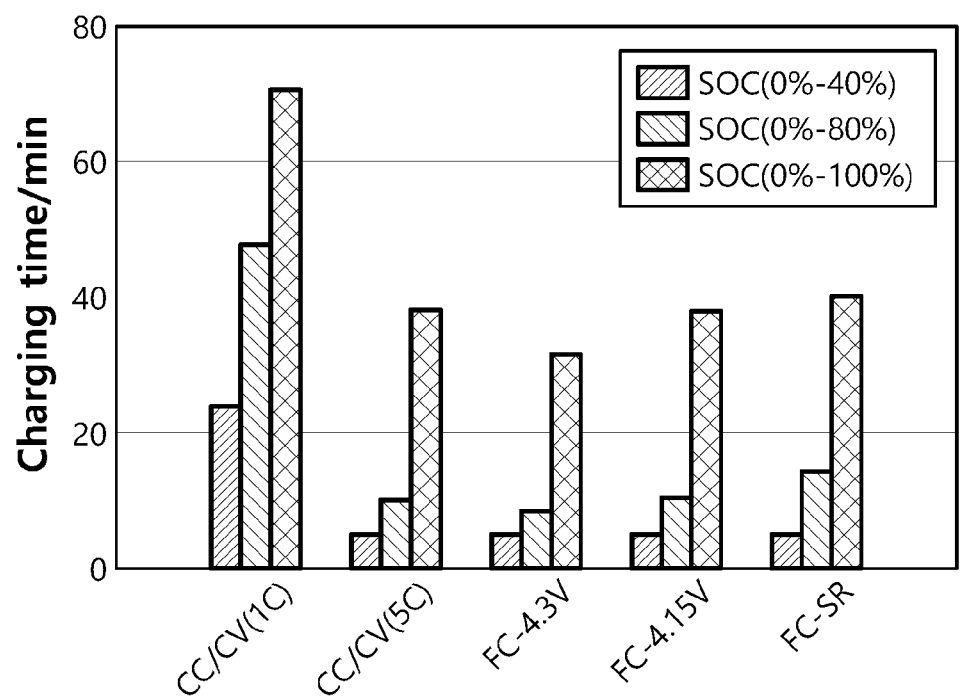
FIG. 18a is a graph showing a charging time of five charging protocols.

After the implementation of the ROM-EKF in the test station, different charging methods are tested at the same test conditions. The test conditions are also used for the simulations. The experiment is repeated until 100 cycles. In each cycle, the lithium-ion battery is charged up to 100% SOC and then discharged with 1C current to a minimum cutoff voltage. The charging times of the five charging protocols in different SOC ranges are summarized in FIG. 18a. The measured charging times are almost the same as those by the simulations. Compared with the normally recommended 1 C-CC/CV charging protocol, the other protocols may reduce the charging time by more than half in the low and middle SOC ranges. However, in the high SOC range, the designed charging methods may not reduce the charging time further. The charging time of the designed charging protocols are almost the same as that in the low SOC range but different in the middle SOC range because different limitations are applied. The FC-SR protocol that limits side reactions takes longer charging time than others by other limitations.

The capacity of the battery is measured after every 10 cycles using the 1 C-CC/CV charging and discharging method. A dimensionless capacity, $Q^+$, is defined as the capacity of the aged cell over that of the fresh cell as in Equation (9) below.

$$Q^* = \frac{Q_{aged}}{Q_{fresh}} \tag{9}$$

Figure 18B:
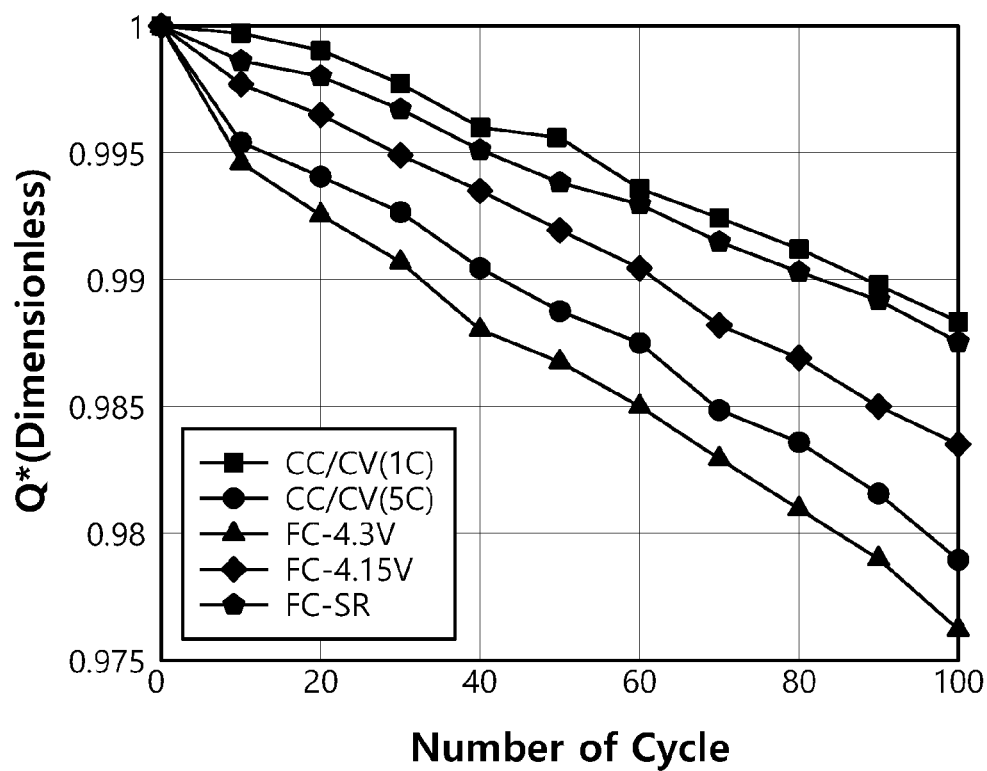
FIG. 18b is a graph showing the variation of capacity according to cycles.

The dimensionless capacities of the charging protocols are shown in FIG. 18b. The comparison between the FC-4.3V charging protocol and the FC-4.15V charging protocol shows that an increase of the cutoff voltage accelerates the aging speed. In addition, the limitation of the charging current by the surface ion concentration helps prevent the capacity fade. This is proved by the comparison between the FC-4.15V charging protocol and the 5 C-CC/CV charging protocol. The capacity fade by the FC-SR charging protocol is at least closest to the capacity fade by the 1 C-CC/CV charging protocol. However, the degradation speed of the FC-SR protocol is still larger than the degradation speed of the 1 C-CC/CV charging protocol. This can be explained by several possible reasons. Firstly, the lithium ion loss by the FC-SR protocol is slightly larger than that by the lithium ion loss by the 1 C-CC/CV charging protocol in the low SOC range. Secondly, the internal temperature of the battery by the FC-SR charging protocol is slightly higher than that by 1 C-CC/CV charging protocol because of the heat generated from the battery although the surface temperature of the battery is kept constant by the calorimeter.

Figure 19A:
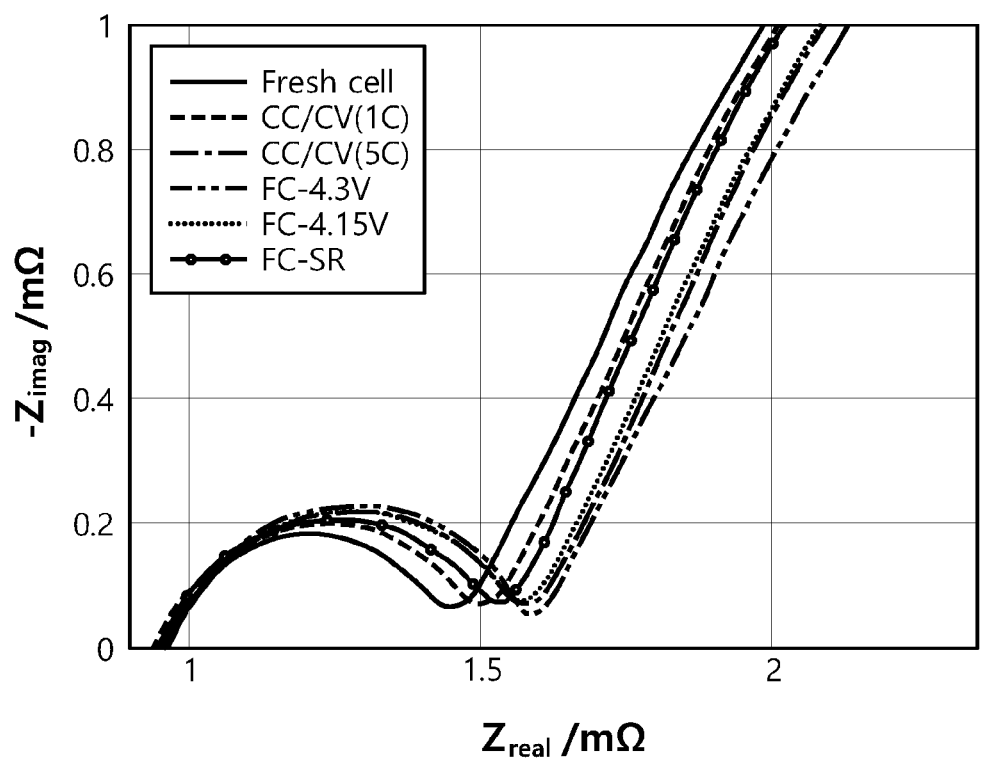
FIG. 19a is a graph showing EIS measurement results of five charging protocols.
Figure 19B:
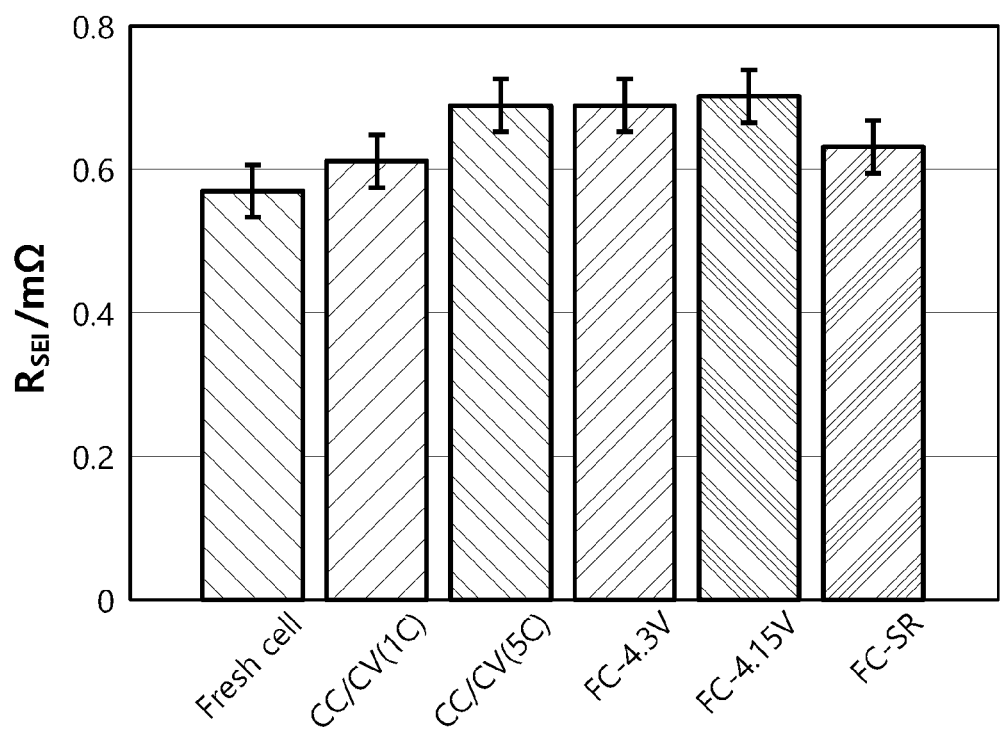
FIG. 19b is a graph showing comparison results between impedances derived from the EIS measurement.

In addition, the impedances at different charging protocols measured by the EIS are shown in FIGS. 19a and 19b. In FIG. 19a, the left intercept between the impedance spectrum and the x-axis at high frequency represents an ohmic resistance. Also, the radius of the first semicircle represents an SEI resistance. Both of the ohmic resistance and the SEI resistance are extracted using an EIS equivalent circuit model. The growth of both resistances is directly related to power fade. The ohmic resistance of different charging protocols is almost the same as the ohmic resistance of a fresh cell. This implies that the side reactions do not contribute to a growth of the ohmic resistance. The growth of the SEI resistance after 100 cycles is dependent upon charging protocols. As shown in FIG. 19b, the SEI resistance of the battery to which the FC-SR charging protocol is applied is comparable to the SEI resistance to which the 1 C-CC/CV charging protocol is applied.

In the above, an optimization of a charging method is proposed that takes charging time and degradation of the secondary battery into account. Effects of charging currents, cutoff voltages and internal variables on degradation are identified and analyzed. In order to find out an optimal charging protocol, the two internal variables, i.e., surface ion concentration and side reaction rate, are estimated by using a ROM-EKF. The upper limits of the surface ion concentration and the side reaction rate are used to limit the charging currents. The method of the present disclosure is implemented in a BIL and tested for 100 cycles, which verifies at least the battery capacity and the power fade.

Effects of different magnitudes of charging current on the charging time and the side reactions in CC/CV charging are different dependent upon SOC ranges. In a low SOC range, a high charging current increases the side reaction but reduces the charging time. Thus, the contribution of the magnitude of the charging current on the aging speed is not significant. In middle and high SOC ranges, the charging current has a significant influence on the aging speed.

The proposed charging method is designed using the ROM-EKF with a side reaction rate model, where cutoff voltage, saturation of ion concentration and maximum side reaction rate are used to limit the charging currents. The method of the present disclosure reduces about half of the charging time compared with the normal 1 C-CC/CV charging method. Increased cutoff voltage decreases the charging time, however increases the capacity and power fade. The limitation by the surface ion concentration helps prevent the capacity and power fade. The charging method limited by the surface ion concentration and the side reaction rate is the best one among others with respect to the charging time and the degradation.

The charging apparatus of a secondary battery according to an embodiment of the present disclosure may be included in an electric-driven apparatus. The electric-driven apparatus includes various devices receiving power from a secondary battery pack, such as smart phones, tablet PCs, laptop computers, electric vehicles, hybrid vehicles, plug hybrid vehicles, electric bicycles, drones, power storage devices, uninterruptible power supplies, and the like.

In addition, the charging apparatus of a secondary battery according to the present disclosure may be included in a secondary battery management system for controlling charging and discharging of the secondary battery.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

INDUSTRIAL APPLICABILITY

The charging apparatus and method of a secondary battery according to the present disclosure is designed using a ROM with a side reaction rate model, where the cutoff voltage, the saturation of surface ion concentration in the anode, and the maximum side reaction rate are used to limit the charging currents. The method of the present disclosure reduces about half of the charging time compared with the normal 1 C-CC/CV charging method. The limitation by the surface ion concentration in the anode helps prevent the capacity and power fade. The charging method limited by the surface ion concentration and the side reaction rate is the best one among the tested charging methods with respect to the charging time and the degradation.

What is claimed is:

1. A charging apparatus of a secondary battery, comprising:
a voltage sensor configured to measure a voltage of the secondary battery;
a temperature sensor configured to measure a temperature of the secondary battery; and
a control unit configured to receive a measured voltage value and a measured temperature value from the voltage sensor and the temperature sensor, respectively, and to adjust a magnitude of a charging current applied to the secondary battery,
wherein the control unit is configured to:
determine an internal state of the secondary battery, which includes an average ion concentration of anode particles, a surface ion concentration of the anode particles, an anode particle potential and an anode electrolyte potential, using a predefined electrochemical reduced order model (ROM);
determine a state of charge (SOC) of the secondary battery from the average ion concentration;
determine a side reaction rate from the anode particle potential and the anode electrolyte potential;
determine whether the measured voltage value reaches a cutoff voltage;
determine whether the surface ion concentration of the anode particles reaches an upper limit concentration;
determine whether the side reaction rate reaches an upper limit rate; and
reduce the magnitude of the charging current applied to the secondary battery from a current charging current amount to an updated charging current amount in response to the measured voltage value reaching the cutoff voltage;
reduce the magnitude of the charging current applied to the secondary battery from the current charging current amount to the updated charging current amount in response to the surface ion concentration of the anode particles reaching the upper limit concentration; and
reduce the magnitude of the charging current applied to the secondary battery from the current charging current amount to the updated charging current amount in response to the side reaction rate reaching the upper limit rate, wherein the updated charging current amount corresponds to an updated SOC value in a prestored profile correlating charging rate values to SOC values, and wherein the updated SOC value is greater than the determined SOC of the secondary battery by a predetermined amount, wherein the predetermined amount is a constant value regardless of the determined SOC of the secondary battery.

2. The charging apparatus according to claim 1, wherein the electrochemical reduced order model is derived from a full order model defined by an ion conservation equation in an electrode, an ion conservation equation in an electrolyte, a charge conservation equation in the electrode, a charge conservation equation in the electrolyte and an electrochemical kinetics equation, wherein the ion conservation equation in the electrode is represented by:

$$\frac{\partial c_s}{\partial t} = \frac{D_s}{r^2}\frac{\partial}{\partial r}\left(r^2\frac{\partial c_s}{\partial r}\right)$$

$$\frac{1}{2}\frac{\partial c_s}{\partial r}\bigg|_{r=0} = 0 \text{ and } D_s\frac{\partial c_s}{\partial r}\bigg|_{r=R_s} = \frac{-j^{Li}}{a_s F}$$

wherein $C_s$ is an ion concentration in solid phase, $D_s$ is a diffusion coefficient in solid phase, $R_s$ is a radius of a spherical electrode particle, $j^{Li}$ is a lithium reaction rate, $a_s$ is a specific surface area of the electrode, F is a Faraday constant, and r is a spherical coordinate wherein the ion conservation equation in the electrolyte is represented by:

$$\frac{\partial(\varepsilon_e c_e)}{\partial f} = \frac{\partial}{\partial x}\left(D_e^{eff}\frac{\partial}{\partial x}c_e\right) + \frac{1-t_+^0}{F}j^{Li}$$

$$\frac{\partial c_e}{\partial x}\bigg|_{x=0} = \frac{\partial c_e}{\partial x}\bigg|_{x=L} = 0$$

wherein $\varepsilon_e$ is porosity, $c_e$ is the ion concentration in the electrolyte, $D_e^{eff}$ is an effective diffusion coefficient in the electrolyte, L is a distance between two electrodes separated by the electrolyte, $j^{Li}$ is a lithium reaction rate, $t_+^0$ is a lithium transference number, F is the Faraday constant, and t is time)

wherein the charge conservation equation in the electrode is represented by:

$$\frac{\partial}{\partial x}\left(\sigma^{eff}\frac{\partial}{\partial x}\varphi_s\right) - j^{Li} = 0$$

$$-\sigma^{eff}\frac{\partial}{\partial x}\varphi_s\bigg|_{x=0} = -\sigma^{eff}\frac{\partial}{\partial x}\varphi_s\bigg|_{x=L} = \frac{I}{A}$$

$$\frac{\partial}{\partial x}\varphi_s\bigg|_{x=\delta_-} = \frac{\partial}{\partial x}\varphi_s\bigg|_{x=\delta_-+\delta_{sep}} = 0$$

wherein $\sigma^{eff}$ is an effective conductivity, $\varphi_s$ is a potential in solid phase, $\gamma_-$ is a thickness of an anode active material layer, $\delta_{sep}$ is a thickness of a separator, I is a current, A is an area of a cell, and x is a coordinate along a moving direction of ions, wherein the charge conservation equation in the electrolyte is represented by:

$$\frac{\partial}{\partial x}\left(\kappa^{eff}\frac{\partial}{\partial x}\varphi_e\right) + \frac{\partial}{\partial x}\left(\kappa_D^{eff}\frac{\partial}{\partial x}\ln c_e\right) + j^{Li} = 0$$

$$\frac{\partial}{\partial x}\varphi_e\bigg|_{x=0} = \frac{\partial}{\partial x}\varphi_e\bigg|_{x=L} = 0$$

wherein $\kappa^{eff}$ is an effective ionic conductivity, $\varphi_e$ is an electrolyte potential, L is the distance between the two electrodes, $j^{Li}$ is the lithium reaction rate, and x is the coordinate along the moving direction of ions, and wherein the electrochemical kinetics equation is represented by:

$$j^{Li} = a_s i_0\left\{\exp\left[\frac{\alpha_a nF}{RT}\eta\right] - \exp\left[-\frac{\alpha_c nF}{RT}\eta\right]\right\}$$

wherein $j^{Li}$ is the lithium reaction rate, $a_s$ is the specific surface area of the electrode, $i_0$ is an exchange current density, $\alpha_a$ is an anodic reaction transfer coefficient, $\alpha_c$ is an cathodic reaction transfer coefficient, $\eta$ is a surface overpotential of the electrode, n is a total number of ions involved in main reactions, F is the Faraday constant, R is a universal gas constant, and T is the temperature.

3. The charging apparatus according to claim 2, wherein the electrochemical reduced order model includes a reduced order equation in which the ion conservation equation in the electrode is simplified by polynomial approximation, wherein the reduced order equation is represented by:

$$\frac{d}{dt}c_{s,ave} + 3\frac{j^{Li}}{R_s a_s F} = 0$$

$$\frac{d}{dt}q_{ave} + 30\frac{D_s}{R_s^2}q_{ave} + \frac{45}{2}\frac{j^{Li}}{R_s^2 a_s F} = 0$$

$$35\frac{D_s}{R_s}(c_{s,surf} - c_{s,ave}) - 8D_s q = -\frac{j^{Li}}{a_s F}$$

wherein $c_{s,ave}$ is an average ion concentration in solid phase, $c_{s,surf}$ is a surface ion concentration in solid phase, $D_s$ is the diffusion coefficient in solid phase, $R_s$ is the radius of the spherical electrode particle, $j^{Li}$ is the lithium reaction rate, $a_s$ is the specific surface area of the electrode, F is the Faraday constant, $q_{ave}$ is a volume-averaged concentration fluxes in solid phase, and t is time.

4. The charging apparatus according to claim 2, wherein the electrochemical reduced order model includes a reduced order equation in which the ion conservation equation in the electrolyte is simplified into a state-space equation, wherein the reduced order equation is represented by:

$$\dot{c}_e = A^* \cdot c_e + B^* \cdot I$$

$$y = C^* \cdot c_e + D^* \cdot I$$

wherein $c_e$ is a state variable in a system,

A* is a first matrix of eigenvalues recombined through reduction,

B* is an identity matrix of [n×1] size,

C* is a second matrix of residues and eigenvalues recombined through reduction,
D* is a sum of residues recombined through reduction and a steady state vector value,
I is the current, and
y is the ion concentration in the electrolyte.

5. The charging apparatus according to claim 2,
wherein the electrochemical reduced order model includes a reduced order equation in which the charge conservation equation in the electrode is simplified using a finite difference method,
wherein the reduced order equation is represented by:

$$\frac{\partial}{\partial x}\left(\frac{\partial}{\partial x}\varphi_s\right) = \frac{j^{Li}}{\sigma^{eff}}$$

$$-\sigma^{eff}\frac{\partial}{\partial x}\varphi_s\bigg|_{x=0} = -\sigma^{eff}\frac{\partial}{\partial x}\varphi_s\bigg|_{x=L} = \frac{I}{A}$$

$$\frac{\partial}{\partial x}\varphi_s\bigg|_{x=\delta_-} = \frac{\partial}{\partial x}\varphi_s\bigg|_{x=\delta_-+\delta_{sep}} = 0$$

wherein $\sigma^{eff}$ is the effective conductivity, $\varphi_s$ is the potential in solid phase, $\delta_-$ is the thickness of the anode active material layer, $\delta_{sep}$ is the thickness of the separator, I is the current, A is the area of the cell, $j^{Li}$ is the lithium reaction rate, and x is the coordinate along the moving direction of ions.

6. The charging apparatus according to claim 2,
wherein the electrochemical reduced order model includes a reduced order equation in which the charge conservation equation in the electrolyte is simplified using a finite difference method,
wherein the reduced order equation is represented by:

$$\frac{\partial}{\partial x}\left(\frac{\partial}{\partial x}\varphi_e\right) + \frac{j^{Li}}{\kappa^{eff}} = 0$$

$$\frac{\partial}{\partial x}\varphi_e\bigg|_{x=0} = \frac{\partial}{\partial x}\varphi_e\bigg|_{x=L} = 0$$

wherein $\kappa^{eff}$ is the effective ionic conductivity, $\varphi_e$ is the electrolyte potential, L is the distance between the two electrodes, $j^{Li}$ is the lithium reaction rate, and x is the coordinate along the moving direction of ions.

7. The charging apparatus according to claim 2,
wherein the electrochemical reduced order model includes a reduced order equation in which the electrochemical kinetics equation is simplified using linearization,
wherein the charge conservation equation is represented by:

$$j^{Li} = a_s i_0 \frac{n(\alpha_a + \alpha_c)F}{RT}\eta$$

wherein $j^{Li}$ is the lithium reaction rate, $a_s$ is the specific surface area of the electrode, $i_0$ is the exchange current density, $\alpha_a$ is the anodic reaction transfer coefficient, $\alpha_c$ is the cathodic reaction transfer coefficient, $\eta$ is the surface overpotential of the electrode, n is the total number of ions involved in main reactions, F is the Faraday constant, R is the universal gas constant, T is the temperature).

8. The charging apparatus according to claim 1,
wherein the control unit is configured to determine a state of charge of the secondary battery from the average ion concentration of the anode particles using a following SOC equation:

$$SOC = \frac{1}{\delta_-}\int_0^{\delta_-}\frac{(c_{s,ave} - c_{s,max}Stoi_{100})}{c_{s,max}(Stoi_{100} - Stoi_0)}$$

wherein SOC is the state of charge, $\delta_-$ is a thickness of an anode active material layer, $c_{s,ave}$ is an average ion concentration in solid phase, $c_{s,max}$ is a maximum ion concentration in solid phase, $Stoi_{100}$ is a stoichiometry at 100% SOC, and $Stoi_0$ is a stoichiometry at 0% SOC.

9. The charging apparatus according to claim 1,
wherein the control unit is configured to determine the side reaction rate of the secondary battery using a following plurality of side reaction kinetics equations:

$$j_{side}^{Li} = -i_{0,side}a_s\exp\left(-\frac{\alpha_{c,side}n_{side}F}{RT}\eta_{side}\right)$$

$$\eta_{side} = \varphi_{s-} - \varphi_{e-} - U_{eq,-} - \frac{R_{SEI}}{a_s}j_{total}^{Li}$$

$$i_{0,side} = k_{side}\sqrt{c_{s,surf}c_{EC,R_s}}$$

wherein $j_{side}^{Li}$ is a lithium side reaction rate, $U_{eq,-}$ is an equilibrium potential of an anode, $i_{0,side}$ is an exchange current density of a side reaction, $R_{SEI}$ is a resistance of solid electrolyte interphase, $a_s$ is a specific surface area of an electrode, $j_{total}^{Li}$ is a lithium total reaction rate, $\alpha_{c,side}$ is a reaction transfer coefficient of the side reaction in a cathode, $k_{side}$ is a kinetic rate constant of the side reaction, $n_{side}$ is a total number of ions involved in the side reaction, $c_{s,surf}$ is a surface ion concentration in solid phase, $\eta_{side}$ is an overpotential of the side reaction, $c_{EC,R_s}$ is an electrolyte concentration of a solid phase surface, F is a Faraday constant, R is a universal gas constant, T is a temperature, $\varphi_{s-}$ is a solid phase potential of the anode, and $\varphi_{e-}$ is the anode electrolyte potential.

10. The charging apparatus according to claim 1,
wherein the control unit is configured to repeatedly perform a time update and to repeatedly determine the internal state of the secondary battery to minimize a difference between the measured voltage value of the secondary battery and an estimated voltage using an extended Kalman filter using a state-space equation for the internal state of the secondary battery, wherein the state-space equation includes an average ion concentration ($c_{z,ave}^k$) in solid phase, an volume-averaged concentration flux ($q_{ave}^k$) in solid phase, a surface ion concentration ($c_{s,surf}^k$), and an output equation for a voltage ($V_t$) of the secondary battery, and wherein the state-space equation is represented by:

$$c_{s,ave}^k = c_{s,ave}^{k-1} - 3\frac{j^{Li,k}}{R_s a_s F}$$

$$q_{ave}^k = q_{ave}^{k-1} - 30 = \frac{D_s \Delta t}{R_s^2}q_{ave}^{k-1} - \frac{45}{2}\frac{j^{Li,k}\Delta t}{R_s^2 a_s F}$$

-continued $$c_{s,surf}^k = c_{z,ave}^k + \frac{8R_s q_{ave}^k}{35} - \frac{R_s j^{Li,k}}{35 D_s a_s F}$$

$$\begin{bmatrix} c_{s,ave}^k \\ q_{ave}^k \end{bmatrix} = \begin{bmatrix} 1 & 0 \\ 0 & 1-30\frac{D_s \Delta t}{R_s^2} \end{bmatrix} \begin{bmatrix} c_{s,ave}^{k-1} \\ q_{ave}^{k-1} \end{bmatrix} + \begin{bmatrix} \frac{-3\Delta t}{R_s a_s F} \\ \frac{-45\Delta t}{2 R_s^2 a_s F} \end{bmatrix}$$

$$V_t = \varphi_s^+ - \varphi_s^- - R_{film} I$$

$$\eta = \varphi_s - \varphi_e + U_{eq}(c_{s,surf}) + \frac{R_{film}}{a_s} j^{Li}$$

wherein $j^{Li}$ is a lithium reaction rate, $a_s$ is a specific surface area of an electrode, F is a Faraday constant, $D_s$ is a diffusion coefficient in solid phase, $R_s$ is a radius of a spherical electrode particle, $\Delta t$ is an update interval is a solid phase potential of a cathode, $\varphi_s^-$ is a solid phase potential of an anode, $\varphi_e$ is an electrolyte potential, $U_{eq}$ is an equilibrium potential, $\eta$ is a surface overpotential of an electrode, $c_{s,surf}$ is a surface ion concentration of a solid phase particle, $R_{film}$ is an ohmic resistance in battery, I is a current, A is an area of a cell, and $R_{SEI}$ is an SEI resistance.

11. The charging apparatus according to claim 1,
wherein the control unit is configured to control a charger, which is coupled to the secondary battery to apply the charging current to the secondary battery, to adjust the magnitude of the charging current.

12. An electric-driven apparatus, comprising the charging apparatus according to claim 1.

13. The charging apparatus according to claim 1, wherein the control unit is configured to reduce the magnitude of the charging current applied to the secondary battery to a charging amount corresponding to an updated state of charge of the secondary battery that is less than a current estimated state of charge of the secondary battery by the predetermined amount.

14. The charging apparatus according to claim 1, wherein the control unit is configured to repeatedly reduce the magnitude of the charging current applied to the secondary battery by the predetermined amount until the measured voltage value does not reach the cutoff voltage, the surface ion concentration of the anode particles does not reach the upper limit concentration, and the side reaction rate does not reach the upper limit rate.

15. A charging method of a secondary battery, comprising:
(a) measuring a voltage and a temperature of the secondary battery;
(b) determining an internal state of the secondary battery, which includes an average ion concentration of anode particles, a surface ion concentration of the anode particles, an anode particle potential and an anode electrolyte potential, using a predefined electrochemical ROM;
(c) determining a SOC of the secondary battery from the average ion concentration of the anode particles;
(d) determining a side reaction rate from the anode particle potential and the anode electrolyte potential;
(e) determining whether any of a plurality of charging current control conditions is satisfied, wherein the plurality of charging current control conditions include (i) a first condition that a measured voltage value reaches a cutoff voltage, (ii) a second condition that the surface ion concentration of the anode particles reaches an upper limit concentration and (iii) a third condition that the side reaction rate reaches an upper limit rate is satisfied; and
(f) reducing the charging current applied to the secondary battery from a current charging current amount to an updated charging current amount unless all of the plurality of charging current control conditions are not satisfied, wherein the updated charging current amount corresponds to an updated SOC value in a prestored profile correlating charging rate values to SOC values, and wherein the updated SOC value is greater than the determined SOC of the secondary battery by a predetermined amount, wherein the predetermined amount is a constant value regardless of the determined SOC of the secondary battery.

16. The charging method according to claim 15,
wherein the electrochemical reduced order model is derived from a full order model defined by an ion conservation equation in an electrode, an ion conservation equation in an electrolyte, a charge conservation equation in the electrode, a charge conservation equation in the electrolyte and an electrochemical kinetics equation
wherein the ion conservation equation in the electrode is represented by:

$$\frac{d}{dt} c_{s,ave} + 3 \frac{j^{Li}}{R_s a_s F} = 0$$

$$\frac{d}{dt} q_{ave} + 30 \frac{D_s}{R_s^2} q_{ave} + \frac{45}{2} \frac{j^{Li}}{R_s^2 a_s F} = 0$$

$$35 \frac{D_s}{R_s} (c_{s,surf} - c_{s,ave}) - 8 D_s q_{ave} = -\frac{j^{Li}}{a_s F}$$

wherein ($c_{s,ave}$ is an average ion concentration in solid phase, $c_{s,surf}$ is a surface ion concentration in solid phase, $D_s$ is a diffusion coefficient in solid phase, $R_s$ is a radius of a spherical electrode particle, $j^{Li}$ is a lithium reaction rate, $a_s$ is a specific surface area of the electrode, F is a Faraday constant, $q_{ave}$ is an volume-averaged concentration fluxes, and t is time),
wherein the ion conservation equation in the electrolyte is represented by:

$$\dot{c}_e = A^* \cdot c_e + B^* \cdot I$$

$$y = C^* \cdot c_e + D^* \cdot I$$

wherein $c_e$ is a state variable in a system,
A*: is a first matrix of eigenvalues recombined through reduction
B*: is an identity matrix of [nx1] size
C*: is a second matrix of residues and eigenvalues recombined through reduction
D*: is a sum of residues recombined through reduction and a steady state vector value
I: is a current
y: is the ion concentration in the electrolyte,
wherein the charge conservation equation in the electrode is represented by:

$$\frac{\partial}{\partial x}\left(\frac{\partial}{\partial x} \varphi_s\right) + \frac{j^{Li}}{\kappa^{eff}}$$

$$-\sigma^{eff}\frac{\partial}{\partial x}\varphi_s\Big|_{x=0} -\sigma^{eff}\frac{\partial}{\partial x}\varphi_s\Big|_{x=L} = \frac{I}{A}$$

$$\frac{\partial}{\partial x}\varphi_e\Big|_{x=\delta_-} = \frac{\partial}{\partial x}\varphi_s\Big|_{x=\delta_-+\delta_{sep}} = 0$$

wherein $\sigma^{eff}$ is an effective conductivity, $\varphi_s$ is a potential in solid phase, $\delta_-$ is a thickness of an anode active material layer, $\delta_{sep}$ is a thickness of a separator, I is the current, A is an area of a cell, $j^{Li}$ is the lithium reaction rate, x is a coordinate along a moving direction of ions, wherein the charge conservation equation in the electrolyte is represented by:

$$\frac{\partial}{\partial x}\left(\frac{\partial}{\partial x}\varphi_e\right) + \frac{j^{Li}}{\kappa^{eff}} = 0$$

$$\frac{\partial}{\partial x}\varphi_e\Big|_{x=0} = \frac{\partial}{\partial x}\varphi_e\Big|_{x=L} = 0$$

wherein $\kappa^{eff}$ is an effective ionic conductivity, $\varphi_e$ is an electrolyte potential, L is a distance between two electrodes separated by the electrolyte, $j^{Li}$ is the lithium reaction rate and x is the coordinate along the moving direction of the ions, and wherein the electrochemical kinetics equation is represented by:

$$j^{Li} = a_s i_0 \frac{n(\alpha_a + \alpha_c)F}{RT}\eta$$

wherein $\kappa^{eff}$ is a lithium reaction rate, $\varphi_e$ is the specific surface area of the electrode, L is an exchange current density, $\alpha_a$ is an anodic reaction transfer coefficient, $\alpha_c$ is a cathodic reaction transfer coefficient, $\eta$ is a surface overpotential of the electrode, n: a total number of ions involved in main reactions, F is the Faraday constant, R is a universal gas constant, and T is the temperature).

17. The charging method according to claim 15, wherein determining a SOC of the secondary battery comprises determining a state of charge of the secondary battery from the average ion concentration of the anode particles using a following SOC equation:

$$SOC = \frac{1}{\delta_-}\int_0^{\delta_-}\frac{(c_{s,ave} - c_{s,max}Stoi_{100})}{c_{s,max}(Stoi_{100} - Stoi_0)}$$

wherein SOC is the: state of charge, $\delta_-$ is a thickness of an anode active material layer, $c_{s,ave}$ is an average ion concentration in solid phase, $c_{s,max}$ is a maximum ion concentration in solid phase, $Stoi_{100}$ is a stoichiometry at 100% SOC, and $Stoi_0$ is a stoichiometry at 0% SOC).

18. The charging method according to claim 15, wherein determining a side reaction rate comprises determining the side reaction rate using a following side reaction kinetics equation:

$$j^{Li}_{side} = -i_{0,side}a_s\exp\left(\frac{-\alpha_{c,side}n_{side}F}{RT}\eta_{side}\right)$$

$$\eta_{side} = \varphi_{s-} - \varphi_{e-} - U_{eq,-} - \frac{R_{SEI}}{a_s}j^{Li}_{total}$$

$$i_{0,side} = k_{side}\sqrt{c_{s,surf}c_{EC,R_s}}$$

wherein $j_{side}^{Li}$ is a lithium side reaction rate, $U_{eq,-}$ is an equilibrium potential of an anode, $i_{0,side}$ is an exchange current density of a side reaction, $R_{SEI}$ is a resistance of solid electrolyte interphase, $a_s$ is a specific surface area of an electrode, $j_{total}^{Li}$ is a lithium total reaction rate, $\alpha_{c,side}$ is a reaction transfer coefficient of the side reaction in a cathode, $k_{side}$ is a kinetic rate constant of the side reaction, $n_{side}$ is a total number of ions involved in the side reaction, $c_{s,surf}$ is a surface ion concentration in solid phase, $\eta_{side}$ is an overpotential of the side reaction, $c_{EC,R_s}$ is an electrolyte concentration of a solid phase surface, F is a Faraday constant, R is a universal gas constant, T is a temperature, $\varphi_{s-}$ is a solid phase potential of the anode, and $\varphi_{e-}$ is the anode electrolyte potential.

19. The charging method according to claim 15, further comprising:

repeatedly performing time updates and measurement updates for the internal state of the secondary battery to minimize a difference between the measured voltage of the secondary battery and an estimated voltage using an extended Kalman filter using a state-space equation for the internal state of the secondary battery, wherein the state-space equation includes an average ion concentration ($c_{z,ave}^k$) in solid phase, an volume-averaged concentration flux ($q_{ave}^k$) in solid phase and surface ion concentration ($c_{s,surf}$) in solid phase, and an output equation for a voltage ($V_t$) of the secondary battery, and wherein the state-space equation is represented by:

$$c_{s,ave}^k = c_{s,ave}^{k-1} - 3\frac{j^{Li,k}\Delta t}{R_s a_s F}$$

$$q_{ave}^k = q_{ave}^{k-1} - 30\frac{D_s\Delta t}{R_s^2}q_{ave}^{k-1} - \frac{45}{2}\frac{j^{Li,k}}{R_s^2 a_s F}$$

$$c_{s,zwf}^k = c_{s,ave}^k + \frac{8R_s q_{ave}^k}{35} - \frac{R_s j^{Li,k}}{35 D_s a_s F}$$

$$\begin{bmatrix}c_{s,ave}^k \\ q_{ave}^k\end{bmatrix} = \begin{bmatrix}1 & 0 \\ 0 & 1-30\frac{D_s\Delta t}{R_s^2}\end{bmatrix}\begin{bmatrix}c_{s,ave}^{k-1} \\ q_{ave}^{k-1}\end{bmatrix} + \begin{bmatrix}\frac{-3\Delta t}{R_s a_s F} \\ \frac{-45\Delta t}{2R_s^2 a_s F}\end{bmatrix}$$

$$V_t = \varphi_s^+ - \varphi_s^- - R_{film}I$$

$$\eta = \varphi_s - \varphi_e + U_{eq}(c_{s,surf}) + \frac{R_{film}}{a_s}j^{Li}$$

wherein $j^{Li}$ is a lithium reaction rate, $a_s$ is a specific surface area of an electrode, F is a Faraday constant, $D_s$ is a diffusion coefficient in solid phase, $R_s$ is a radius of a spherical electrode particle, $\Delta t$ is an update interval $\varphi_s^+$ is a solid phase potential of a cathode, $\varphi_z^-$ is a solid phase potential of an anode, $\varphi_e$ is an electrolyte potential, $U_{eq}$ is an equilibrium potential, $\eta$ is a surface overpotential of an electrode, $c_{s,surf}$ is a surface ion concentration of a solid phase particle, $R_{film}$ is an ohmic resistance in battery, I is a current, A is an area of a cell, and $R_{SEI}$ is an SEI resistance.

20. The charging method according to claim 15, wherein reducing the charging current applied to the secondary battery comprises controlling a charger coupled to the secondary battery to apply a charging current to the secondary battery to reduce a magnitude of the charging current.

\* \* \* \* \*